United States Patent [19]
Otsuchi et al.

[11] Patent Number: 6,111,338
[45] Date of Patent: *Aug. 29, 2000

[54] ACCELERATION SENSOR AND METHOD FOR PRODUCING THE SAME

[75] Inventors: Tetsuro Otsuchi, Osaka; Osamu Kawasaki, Kyoto; Hidenobu Shintaku, Neyagawa; Shigeo Suzuki, Hirakata; Takahiro Nishikura, Ikoma; Katsumi Imada, Katano; Masanori Sumihara, Higashiosaka; Katsu Takeda, Osaka; Takashi Nojima, Katano, all of Japan

[73] Assignee: Matsushita Electric Industrial Co., Ltd., Osaka, Japan

[*] Notice: This patent issued on a continued prosecution application filed under 37 CFR 1.53(d), and is subject to the twenty year patent term provisions of 35 U.S.C. 154(a)(2).
This patent is subject to a terminal disclaimer.

[21] Appl. No.: 08/782,742

[22] Filed: Jan. 13, 1997

Related U.S. Application Data

[63] Continuation of application No. 08/413,098, Mar. 29, 1995, abandoned, which is a continuation-in-part of application No. 08/249,738, May 26, 1994, Pat. No. 5,521,457.

[30] Foreign Application Priority Data

| May 28, 1993 | [JP] | Japan | 5-126920 |
| May 28, 1993 | [JP] | Japan | 5-126921 |
| Aug. 23, 1993 | [JP] | Japan | 5-207652 |
| Mar. 8, 1994 | [JP] | Japan | 6-36963 |
| Mar. 31, 1994 | [JP] | Japan | 6-062679 |

[51] Int. Cl.[7] ................................. H01L 41/08
[52] U.S. Cl. .................. 310/352; 310/344; 310/354; 310/353
[58] Field of Search .................. 310/349, 348, 310/351, 352, 354–356

[56] References Cited

U.S. PATENT DOCUMENTS

| 2,371,613 | 3/1945 | Fair | 310/352 |
| 2,474,241 | 6/1949 | Garrison | 310/355 X |
| 3,206,986 | 9/1965 | Christensen | 310/332 X |
| 3,789,248 | 1/1974 | Jaecklin et al. | 310/355 |
| 4,104,921 | 8/1978 | Nissi | 73/517 R |
| 4,183,126 | 1/1980 | Ikeno et al. | 310/352 X |
| 4,317,093 | 2/1982 | Lungo | 310/355 X |
| 4,418,299 | 11/1983 | Momosaki | 310/352 X |
| 4,608,509 | 8/1986 | Yamamoto et al. | 310/354 X |
| 4,695,756 | 9/1987 | Tanaka | 310/355 |
| 5,144,837 | 9/1992 | Komurasaki | 73/517 R |
| 5,239,869 | 8/1993 | Nemura et al. | 73/517 R |
| 5,430,342 | 7/1995 | Watson | 310/332 X |
| 5,473,930 | 12/1995 | Gademann et al. | 310/332 X |
| 5,521,457 | 5/1996 | Kawasaki et al. | 310/352 |
| 5,539,270 | 7/1996 | Kaji et al. | 310/329 |

FOREIGN PATENT DOCUMENTS

| 59-70923 | 4/1984 | Japan . |
| 1120615 | 8/1989 | Japan . |
| 1250815 | 10/1989 | Japan . |
| 2248086 | 10/1990 | Japan . |
| 2248866 | 10/1990 | Japan . |
| 520422 | 3/1993 | Japan . |
| 523617 | 3/1993 | Japan . |

*Primary Examiner*—Mark O. Budd
*Attorney, Agent, or Firm*—Renner, Otto, Boiselle & Sklar LLP

[57] ABSTRACT

An acceleration sensor includes: a piezoelectric vibrator including a piezoelectric element having a first principal surface and a second principal surface opposed each other, a first and a second electrode formed on the first and the second principal surface, and conductive protrusions made of a metal material or a ceramic material and formed by a thermal spraying process; and a holding body for holding the piezoelectric vibrator via the conductive protrusions.

24 Claims, 29 Drawing Sheets

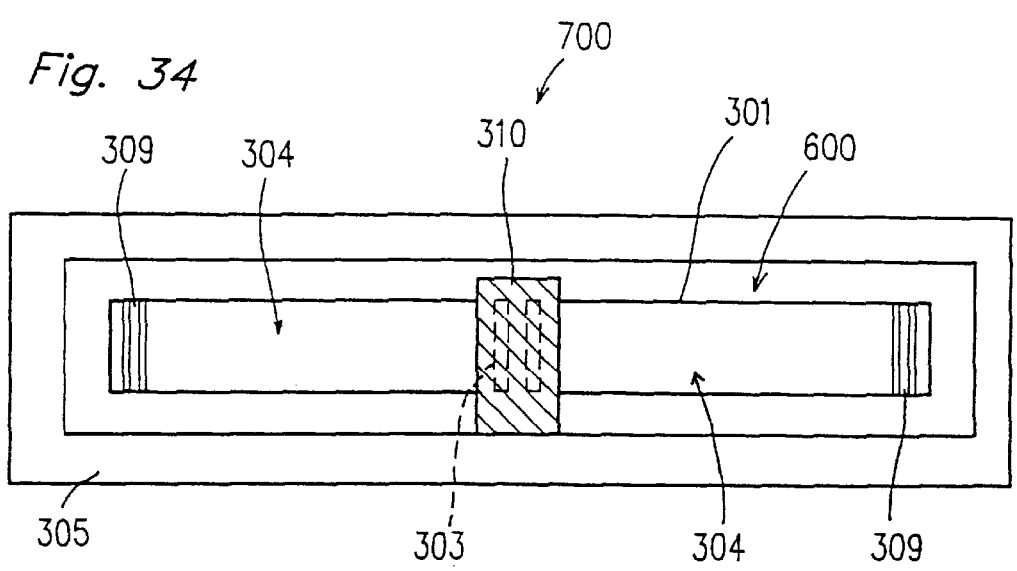

ACCELERATION SENSOR AND METHOD FOR PRODUCING THE SAME

This is a continuation of application Ser. No. 08/413,098 filed on Mar. 29, 1995 now abandoned, which is a continuation-in-part of application Ser. No. 08/249,738 filed on May 26, 1994, now U.S. Pat. No. 5,521,457.

BACKGROUND OF THE INVENTION

1. Field of the Invention

The present invention relates to an acceleration sensor used for measuring acceleration or detecting vibration; and a method for producing the same. More particularly, the present invention relates to a high-performance acceleration sensor of a small size and a method for producing the same.

2. Description of the Related Art

A piezoelectric vibrator is used for a mechanical filter, an oscillator, an actuator or the like and it is made of a piezoelectric material such as a piezoelectric ceramic, quartz or lithium niobate. A suitable oscillation mode such as bending oscillation is selected according to a frequency range to be used. When an alternating electric voltage is applied to a piezoelectric vibrator, it is oscillated due to the piezoelectric effect with a low oscillation loss. Such a piezoelectric vibrator has large mechanical quality coefficients $Q_n$ and large coupling coefficients. Therefore, a filter can have a wider range and a vibrator has a better frequency precision than an LC filter and a vibrator using a capacitor and a coil.

In order to utilize such features of a piezoelectric vibrator, it is important to support or fix a piezoelectric vibrator correctly and surely at a node where the oscillation amplitude becomes zero so as not to suppress oscillations generated in the piezoelectric vibrator in a holding structure thereof.

A node in a piezoelectric vibrator is a point or a line with zero area. Therefore, it is desirable that the holding structure holds a piezoelectric vibrator at a point or at a line. However, it is impossible practically to hold a piezoelectric vibrator at a point or at a line. Further, it is also needed to hold it stably. Then, a piezoelectric vibrator is practically held at a point-like area or at a linear area by sacrificing the characteristics thereof somewhat.

Priorly, a piezoelectric vibrator is supported or fixed around a node with use of springs. However, this technique has following problems: (1) It is difficult to set positions for supporting or fixing a piezoelectric vibrator correctly around a node. (2) If a piezoelectric vibrator is supported or fixed strongly or a strong force is applied to the piezoelectric vibrator for supporting or fixing it surely, the characteristics of the piezoelectric vibrator are deteriorated or the piezoelectric vibrator is destroyed mechanically. (3) It is needed to support or fix a piezoelectric vibrator on a certain area in order to hold it at a particular posture. However, because a node of the. piezoelectric vibrator is a point or a line with no area, this means that vibrating portions in the piezovibrator are held or fixed. Therefore, vibrations are suppressed and characteristics of the piezoelectric vibrator are deteriorated.

FIG. 1 illustrates a concept of holding of a piezoelectric vibrator 1 at points. Driving electrodes 2 are formed on two opposing principal planes of a piezoelectric vibrator 1 of a square plate made of a piezoelectric material. When an alternating voltage is applied to the driving electrodes 2, expansion vibrations of the square plate are generated. Because the vibrations has a node point at a center of the square plate, the piezoelectric vibrator 1 is held by holders 3 to interpose it at two sides with an applied pressure. A top of the holder 3 has a flat region with a certain area, and the piezoelectric vibrator 1 is held stably by abutting it to the flat regions of the holder 3 at two principal planes. Further, the elastic property of the holder 3 buffers vibrations propagated from the outside.

FIG. 2 illustrates a concept of holding of a piezoelectric vibrator 1 at a line. Driving electrodes 5 are formed on two opposing principal planes of a piezoelectric vibrator 4 of a rectangular plate made of a piezoelectric material. When an alternating voltage is applied to the driving electrodes 5, longitudinal vibrations of the rectangular plate are generated having main vibrations along a longitudinal direction of the rectangular plate. Because the vibrations has a node line at a center line of the rectangular plate, the piezoelectric vibrator 4 is held at two principal planes with an applied pressure by interposing it between two holders 6. A top of the holder 6 has a flat region with a certain area, and the piezoelectric vibrator 4 is held stably by abutting the flat regions thereto at two sides. Further, the elastic property of the holder 6 buffers vibrations propagated from the outside.

As described above, prior art holding structures hold a piezoelectric vibrator directly with holders at point-like areas or at line-like areas having a finite area. Therefore, if the contact areas for holding are decreased, holding becomes unstable. Further, when a shock is given for example by falling it to the ground, the posture or position is liable to change vibration characteristics largely. On the other hand, if the holding area is increased, a part of vibrating region is pressed and both mechanical quality coefficients and coupling coefficients decrease to deteriorate vibration characteristics.

Because a piezoelectric vibrator is held directly with holders, a contact area between the vibrator and the holder and a holding position of the holders vary for each piezoelectric vibrator, and it is also a problem that the characteristic of the piezoelectric vibrator scatters. To sum up, it is difficult to hold a piezoelectric vibrator stably and reliably without affecting vibrator characteristics.

In order to solve the above-mentioned problems, it is proposed to form protrusions at positions for supporting or fixing a piezoelectric vibrator and to support it at the protrusions. This technique has an advantage that if protrusions can be formed correctly at a node, the position for supporting or fixing can be set surely around the node. Priorly, such protrusions are formed with a hard soldering process, a soldering process or a plating for a metallic material and with a printing process for an organic electrically conductive paint. The protrusions are made of an electrically conducting material because electrical leads are connected at the protrusions.

Japanese Utility Model laid open Publication 20422/1993 proposes a holding structure of piezoelectric vibrator wherein protrusions made of electrically conductive rectangular rubber are formed around a node point of vibrations of a piezoelectric vibrator and the piezoelectric vibrator is held at the protrusions. However, this holding structure has a problem that protrusions are deformed with a pressure applied for holding. Then, a contact area between the vibrator and the holders are not constant among piezoelectric vibrators, and the characteristics of the piezoelectric vibrator scatter broadly.

In recent years, the size of electronic apparatuses have been much reduced, so that a portable electronic apparatus such as a notebook-type personal computer are now widespread. Therefore, there is strong demand for the development of a high-performance acceleration sensor of a small size which may ensure and improve the reliability of electronic apparatuses of this type against impact given to such apparatuses. For example, an impact given to an apparatus which is going to write some data into a high-density hard disk would cause the positional deviation of the writing head thereof. Such positional deviation might result in a write error of the data or might damage the head. In order to prevent such accidents, it is necessary to detect the impact given to the hard disk thereby suspending the writing operation or allowing the head to escape to a safe position.

Conventionally, an acceleration sensor has generally been made of a piezoelectric material such as piezoelectric ceramic. An acceleration sensor of this type may accomplish a high detection sensitivity by utilizing the electromechanical transduction characteristics of a piezoelectric material used for the sensor. A piezoelectric acceleration sensor transduces the force given by the acceleration or the vibration into a voltage based on the piezoelectric effects so as to output the voltage. An acceleration sensor of this type is known by a rectangular bimorph piezoelectric element under a cantilever type structure disclosed in Japanese Laid-Open Patent Publication No. 2-248086. Such a cantilever type structure is shown in FIG. 36. As shown in FIG. 36, one end of the piezoelectric vibrator 311 with a bimorph structure is clamped by a holding member 313 with a conductive adhesive 315 or the like. Since the resonance frequency of such a bimorph piezoelectric element under the cantilever type structure is low, the element is used for measuring acceleration having relatively low frequency components. On the other hand, in the case of measuring the acceleration in a high frequency region, a rectangular bimorph piezoelectric element with a both ends clamped structure shown in FIG. 37 is used. As shown in FIG. 37, both ends of the piezoelectric vibrator 311 under a bimorph structure are clamped by the holding members 313 with an adhesive 315 or the like. The resonance frequency of the piezoelectric vibrator may be made relatively high by clamping both ends of the piezoelectric vibrator.

Although the acceleration sensor under the cantilever type structure mentioned above exhibits high sensitivity to the vibration in a low frequency region, the acceleration sensor exhibits low sensitivity to the vibration in a high frequency region and low impact-resistance. On the other hand, according to the acceleration sensor under the both ends clamped structure, a wide range of frequency region may be detected and the impact-resistance thereof is high, whereas, the sensitivity to the frequency is disadvantageously low and the downsizing thereof is very difficult.

In addition, in order to stabilize the sensitivity of a rectangular bimorph piezoelectric element, it is necessary to stabilize the resonance frequency thereof. Accordingly, the bimorph piezoelectric element is required to be held under an even stabler state. However, in actual use, some stress generated by mechanical or thermal variations causes a deviation in a portion supported by a metallic supporting member or in a portion clamped by a metallic holding member. For example, in the case of clamping the bimorph piezoelectric element by using an adhesive, the clamp point of the element changes depending on the application range of an adhesive. In addition, in accordance with the variation of the temperature of the adhesive, the clamping state of the element is varied, so that it becomes difficult to hold the element under a satisfactorily stable state.

An exemplary method for stably clamping a piezoelectric element is disclosed in Japanese Laid-Open Patent Publication No. 59-70923. In this patent publication, a slit is provided in a central portion of a bimorph piezoelectric vibrator, thereby forming a cantilever type structure so as to clamp the peripheral portion of the bimorph piezoelectric vibrator. According to this method, however, the area of the clamping portion, other than the cantilever type structure formed by the slit for contributing to the detection of the acceleration, is large, so that the size of the element also becomes disadvantageously large as a whole. Therefore, it is difficult to produce a small-sized acceleration sensor by this method.

In order to improve the sensitivity to acceleration, it is preferable to support the piezoelectric vibrator so that the inclination of the displacement of the vibrator, which is caused by the vibration, is limited at the supported point, as compared with completely clamping the piezoelectric vibrator so that the inclination of the displacement becomes zero at the clamp point. This is because the same acceleration gives a larger distortion to the piezoelectric vibrator supported by the former method, as compared with the distortion given to the piezoelectric vibrator completely clamped by the latter method. As a result, the output sensitivity of the piezoelectric vibrator held by the former method becomes larger. According to the conventional method mentioned above, however, it is difficult to stabilize the supporting state; the supporting state and the clamping state are interchangeable depending upon the fabrication conditions; the variation of the resonance frequency of the piezoelectric vibrator becomes large, and therefore the variation of the sensitivity to the acceleration also becomes adversely large.

Japanese Laid-Open Utility Model Publication No. 5-23617 discloses a holding structure for constituting a piezoelectric resonator in which a piezoelectric vibrator is held at square pillar shaped metallic protrusions formed on the surface of the piezoelectric vibrator. Unlike an acceleration sensor, the piezoelectric resonator disclosed in Japanese Laid-Open Utility Model Publication No. 5-23617 is an element utilizing the resonance phenomena of a vibrator, and therefore the metallic protrusions are provided at the position of the node of the vibrator so as not to obstruct the resonance of the vibrator. According to this utility model publication, the square pillar shaped metallic protrusions are formed by brazing, welding, melting, adhesion, or the like.

In the case of forming the metallic protrusions by brazing, welding or melting, the piezoelectric vibrator is heated at a high temperature during the formation of the protrusions, so that the characteristics of the piezoelectric vibrator deteriorate. In particular, in the case where piezoelectric ceramic is used as a material for the vibrator, the characteristics of the vibrator deteriorate greatly when it is heated to a high temperature, because the Curie temperature of a piezoelectric ceramic material is low and so the heat resistance thereof is low. The Curie temperature of a piezoelectric ceramic material used for a piezoelectric vibrator is approximately in the range of 250 to 350° C. If a piezoelectric vibrator is heated at a temperature half as high as the Curie temperature (centigrade) or higher, i.e. in the range of 125 to 175° C. or higher, then the characteristics of the piezoelectric vibrator deteriorate considerably. Therefore, in the case where the protrusions are formed on the piezoelectric vibrator by such a process as brazing and soldering in which the vibrator is heated at a high temperature, considerable deterioration of the piezoelectric vibrator is inevitable. FIG. 38 is a graph showing the relationship between the piezoelectric constant of a piezoelectric ceramic material and the heating temperature. In this case, the piezoelectric ceramic material with a Curie temperature of 300° C. is heated for an hour. As shown in FIG. 38, the piezoelectric constant does not change until the heating temperature reaches 140° C., but the piezoelectric constant decreases when the heating temperature is over 140° C. As the heating temperature becomes higher, the piezoelectric constant decreases in shorter time (not shown in FIG. 38). In fact, if the protrusions are formed on the piezoelectric vibrator by a process such as brazing and soldering, then the characteristics of the piezoelectric vibrator are considerably degraded.

On the other hand, in the case where the metallic protrusions are formed on the piezoelectric vibrator by using an adhesive, the adhesive protrudes from the adhesion interface between the piezoelectric vibrator and the protrusions. Since the amount of the protruding adhesive is not constant, the variation and the deterioration of the characteristics of the vibrator are disadvantageously large.

In principle, it is possible to form the metallic protrusions by a plating process without heating the vibrator at a high temperature. However, it takes a long time to form a thick protrusion by a plating process, so that a protrusion with a thickness of only several $\mu$m can be formed practically. If a piezoelectric vibrator made of a piezoelectric ceramic material is held at protrusions with such a small height, even only a slight inclination of the piezoelectric vibrator will make the vibrator come in contact with the holding member or the like for holding the protrusions, because the surface of a piezoelectric ceramic material has a ruggedness of 3 to 5 $\mu$m. The contact of the piezoelectric vibrator with another member is equivalent to the displacement of the portion holding the piezoelectric vibrator, so that the length from the hold point of the piezoelectric vibrator to the extremity thereof changes, thereby varying the resonance frequency and the frequency characteristics of the piezoelectric vibrator. In the case of forming the protrusions by a printing process or the like using an organic material such as a conductive paste, it is also difficult to form thick protrusions, so that the same kinds of problems occur as those of the plating process. In addition, the protrusions obtained by a printing process have weak mechanical strength and weak adhesive strength. Accordingly, it is difficult to hold the piezoelectric vibrator stably.

SUMMARY OF THE INVENTION

The acceleration sensor of the invention includes: a piezoelectric vibrator including a piezoelectric element having a first principal surface and a second principal surface opposed each other, a first and a second electrode formed on the first and the second principal surface, and conductive protrusions made of a metal material or a ceramic material and formed by a thermal spraying process; and a holding body for holding the piezoelectric vibrator via the conductive protrusions.

In one embodiment of the invention, the conductive protrusions are formed in longitudinal central portions of the piezoelectric vibrator.

In another embodiment of the invention, the holding body includes a holding member having an elastic property, and the piezoelectric vibrator is held by the holding member via at least one of the conductive protrusions formed on the first and second electrode piezoelectric vibrator.

In still another embodiment of the invention, the piezoelectric vibrator is press-fitted into the holding body and the piezoelectric vibrator is held via the conductive protrusions by the holding body.

In still another embodiment of the invention, the holding body includes a holding member made of a material having a lower hardness than that of the conductive protrusions and at least one of the protrusions is press-fitted into the holding member.

In still another embodiment of the invention, the piezoelectric element is selected from a group including: a bimorph piezoelectric element; a multi-layered piezoelectric element obtained by attaching multiple piezoelectric plates; a single layered piezoelectric element; a unimorph piezoelectric element obtained by attaching a piezoelectric plate to a shim; a bimorph piezoelectric element interposing a shim therebetween; and a piezoelectric element including a piezoelectric film deposited on a substrate and an electrode.

In still another embodiment of the invention, the piezoelectric vibrator further includes protrusions made of a metal material or a ceramic material and formed by a thermal spraying process in longitudinal end portions of the piezoelectric vibrator on at least one of the first and second electrodes.

In still another embodiment of the invention, the conductive protrusions are arranged in a symmetric manner on the first and second electrodes.

In still another embodiment of the invention, the conductive protrusions are linear protrusions extending in a width direction of the piezoelectric vibrator.

In still another embodiment of the invention, a length in a longitudinal direction of the piezoelectric element is longer than 3.5 times of that in a width direction.

In still another embodiment of the invention, a height of the conductive protrusions is in a range of 50 $\mu$m to 150 $\mu$m.

According to another aspect of the invention, a method for producing an acceleration sensor including a piezoelectric vibrator including a piezoelectric element having a first principal surface and a second principal surface opposed each other, a first and a second electrode formed on the first and the second principal surface is provided. The method includes the step of: forming a conductive protrusion by thermally spraying a metal material or a ceramic material on at least one of the first and second electrodes.

In one embodiment of the invention, the method further includes a step of forming a holding body for holding the piezoelectric element via the conductive protrusion.

In another embodiment of the invention, the conductive protrusion forming step includes a step of forming the protrusion on the piezoelectric element by thermally spraying a metal material or a ceramic material via a mask having an opening in a portion corresponding to a longitudinal central portion of the piezoelectric vibrator.

In still another embodiment of the invention, the opening is a linear opening extending in a width direction of the piezoelectric vibrator.

In still another embodiment of the invention, the protrusion is formed on the first and the second electrodes.

In still another embodiment of the invention, a height of the conductive protrusions is in a range of 50 $\mu$m to 150 $\mu$m.

In still another embodiment of the invention, the holding body include a holding member having an elastic property, and the piezoelectric vibrator is held by the holding member via at least one of the conductive protrusions formed on the first and second electrode piezoelectric vibrator.

In still another embodiment of the invention, the holding body includes a holding member made of a material having a lower hardness than that of the conductive protrusions and at least one of the protrusions is press-fitted into the holding member.

In still another embodiment of the invention, the method further includes a step of forming protrusions by thermally spraying a metal material or a ceramic material in longitudinal end portions of the piezoelectric vibrator on at least one of the first and second electrodes.

The piezoelectric vibrator of the acceleration sensor of the invention includes electrically conductive protrusions, made of a metal material or a ceramic material, formed by a thermal spraying process and is held through at least one of the conductive protrusions. The conductive protrusion formed by the thermal spraying process has a high mechanical strength, thereby holding the piezoelectric vibrator stably. Therefore, the accelerator has improved shock resistance. Moreover, by holding the piezoelectric vibrator at its center portion, the end portions thereof may vibrate freely in the same way as a piezoelectric vibrator under a cantilever type structure, so that the piezoelectric vibrator exhibits high sensitivity and is also capable of measuring vibrations (accelerations) with high frequency components. Moreover, since the conductive protrusions are formed by a thermal spraying process, the piezoelectric element is never heated at a high temperature during the processing of the element, thereby preventing the thermal deterioration of the piezoelectric characteristics. The area required for holding the piezoelectric vibrator is small, so that an element may be downsized. Furthermore, since the conductive protrusions may be processed by the thermal spraying process with high precision, it becomes possible to provide a production method excellent in the reproducibility of the piezoelectric characteristics, the stable mass-productivity. In addition, the conductive protrusions are formed on the electrode on the piezoelectric vibrator, so that the charges generated by the acceleration (or the vibration) may be output to an external electrode easily.

In still another aspect of the invention, a piezovibrator comprises a piezoelectric plate made of a piezoelectric material having electrodes formed on two principal planes thereof. A protrusion made of an electrically conductive material is formed on a node of vibrations of the piezoelectric plate on each of principal planes of the piezoelectric plate. The protrusion have a top surface with roughness of a few micrometers or more, and they are formed for example with a thermal spraying process. Thus, electrically conductive hard protrusions can be formed without heating. A holder means holds the piezoelectric plate at the protrusion on each of principal planes of the piezoelectric plate. A contact area between the piezoelectric plate and the holder means is kept small, and the contact is kept strong. Even if a relative position between them is displaced somewhat, a holding position viewed from the piezoelectric plate is kept constant.

Thus, the invention described herein makes possible the advantages of providing (1) a holding structure of a piezoelectric vibrator in which the excellent characteristic of the piezoelectric vibrator is kept stable and has small scattering, (2) a manufacturing method of a piezoelectric vibrator in which a holding structure of piezovibrator can be formed at a low temperature without affecting the vibration characteristics of the piezovibrator, (3) a small-sized acceleration sensor having excellent impact-resistance and high sensitivity over a wide frequency range, and (4) a method for producing the same.

These and other advantages of the present invention will become apparent to those skilled in the art upon reading and understanding the following detailed description with reference to the accompanying figures.

BRIEF DESCRIPTION OF THE DRAWINGS

FIG. 34 is a cross-sectional view of the acceleration sensor taking along a line X—X in FIG. 33

DESCRIPTION OF THE PREFERRED EMBODIMENTS

Figure 1:
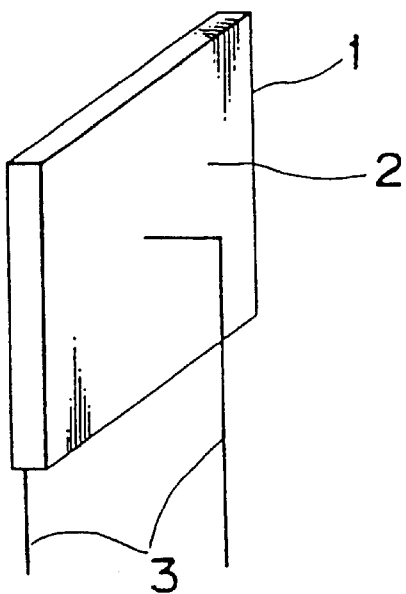
FIG. 1 is a schematic perspective view of a prior art piezoelectric vibrator held at points.
Figure 2:
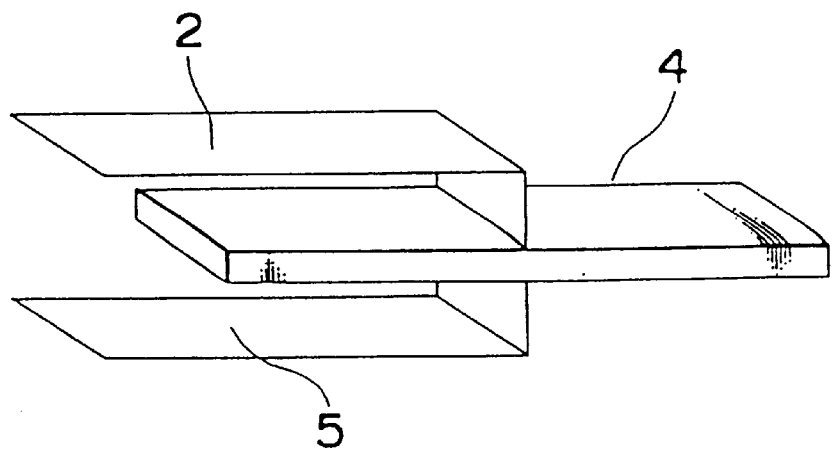
FIG. 2 is a schematic perspective view of a prior art piezoelectric vibrator held at lines.

Referring now to the drawings, wherein like reference characters designate like or corresponding parts throughout the views, embodiments of the invention are explained. In the present invention, protrusions are formed on a piezoelectric plate around a node of vibrations by depositing particles of electrically conductive material such as a metal or a ceramic with a thermal spraying process or the like. Then, the piezoelectric plate is held by holder means by contacting the top of the protrusions with the holder means. The following advantages can be realized by using protrusions formed by using a thermal spraying process or the like: (1) When the protrusions are formed, the temperature of a piezoelectric plate does not become so high as to deteriorate the characteristics thereof; (2) The protrusions can be formed thick enough to stabilize a supporting or fixing posture and the holding means are prevented from contacting with the piezoelectric plate even if the posture changes a little. Such thick protrusions can be formed thick in a short time with a thermal spraying process because sprayed particles have larger sizes than particles deposited in vacuum deposition, sputtering deposition or the like; (3) The protrusions has a high mechanical strength and a high adhesion strength to prevent them from sliding against the piezoelectric plate even if an external shock is applied to the piezoelectric plate by falling or the like. Because particles to be deposited as the protrusions have larger sizes in a thermal spraying process than in a sputtering process or the like, they stick into the piezoelectric plate more strongly and more surely when the protrusions are formed; (4) The protrusions have rough surfaces because sprayed particles to be deposited as the protrusions have large sizes in a thermal spraying process. Then, they can be stuck into a holding member like wedges so that they can support or fix the piezoelectric plate stably and surely even if they are not pressed so strongly; (5) Protrusions can be formed only around nodes of vibrations precisely and with a fine pitch in order not to suppress vibrations.

Figures 3, 4:
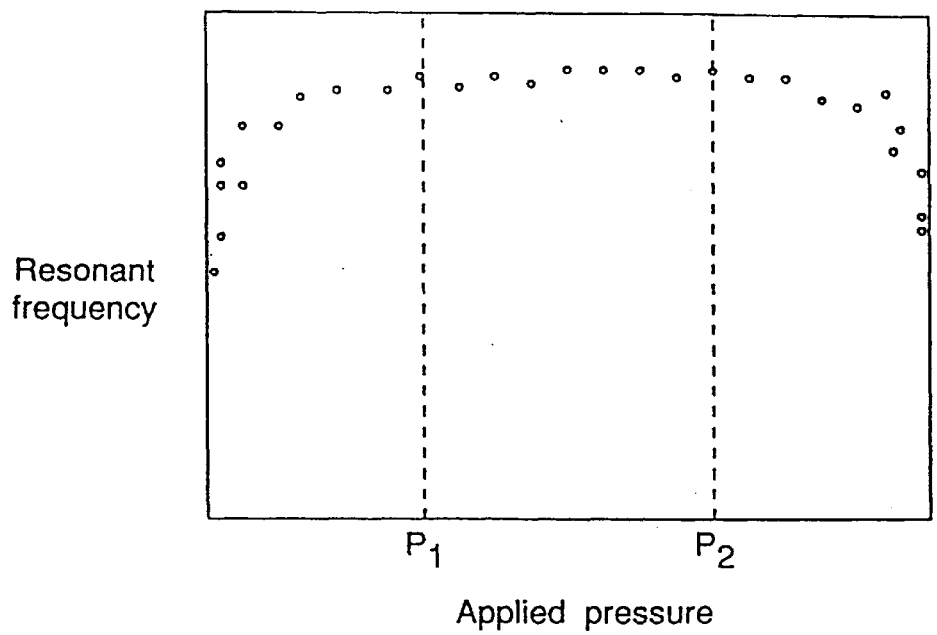
FIG. 3 is a graph of a characteristic of vibrant frequency plotted against applied pressure.
FIG. 4 is a graph of external impact force resistance plotted against roughness at surfaces of protrusions formed on a piezoelectric vibrator element.

Next, effects of roughness of surfaces of the protrusions are explained in a holding structure of piezoelectric vibrator. When a piezoelectric plate is supported or fixed at the protrusions, a force applied to the protrusions have to be kept within a certain range in order to keep supporting or fixing conditions for the piezoelectric element constant. FIG. 3 shows a characteristic of vibrant frequency plotted against applied pressure when a piezoelectric plate is supported or fixed at protrusions formed with a thermal spraying process on the piezoelectric plate. If the applied pressure is $P_1$ or lower, the supporting or fixing of the piezoelectric vibrator element is unstable. Then, vibrant frequencies scatter largely and characteristic thereof are also unstable. On the other hand, if the applied pressure is $P_2$ or higher, losses due to the supporting or fixing become large and characteristic of the piezoelectric plate becomes unstable again, or the piezoelectric plate is broken mechanically. It is needed to keep the applied force at the protrusions within a certain range of between $P_1$ and $P_2$ so as to keep supporting or fixing conditions constant roughly. The values of $P_1$ and $P_2$ vary with a material, a size, vibration mode or the like of the piezoelectric plate or with a material, a size, a shape or the like of a holding means. It is desirable that an applied pressure is set at a lower value within the range in order to enhance the reliability of the piezoelectric plate.

The protrusions have an effect to set an applied pressure at a lower value within the range. FIG. 4 shows durability against external impact force plotted against roughness at surfaces of protrusions formed on a piezoelectric plate. The piezoelectric plate is pressed at a value within the above-mentioned range of applied pressure for realizing stable characteristics. The ordinate represents an upper limit of an external impact force which does not affect the characteristics of the piezoelectric plate. If the roughness at the surfaces is less than 2 $\mu$m, an external impact force change supporting or fixing structure and affects the characteristics of the piezoelectric plate. On the contrary, if the roughness is 2 $\mu$m or larger, the rough surface sticks into a holding member like wedges and the characteristics of the piezoelectric plate are not deteriorated if the external impact force becomes large. The value of the permissible limit of the external impact force vary with a material, a size or the like of the protrusions or with a material, a shape or the like of the holding member. The characteristics of the piezoelectric plate become stable if the roughness is 2 $\mu$m or larger though the lower limit of the roughness depends a little on the applied pressure. Though the upper limit is not shown in FIG. 4, it is understood that the roughness does not exceed the width of a protrusion itself.

A thermal spraying process is used for forming protrusions on a piezoelectric plate made of a piezoelectric material. After electrodes are formed on two principal planes or the piezoelectric plate, electrically conductive protrusions are formed on the electrodes at a node of vibrations of the piezoelectric plate. In an example of the thermal spraying process, particles of sizes between 5–300 $\mu$m of a starting material are passed through a plasma at a high temperature so that they are melted. Then, the melted particles are blown along a gas stream to a piezoelectric plate to be deposited on the piezoelectric plate to form protrusions. The size of the particles of a starting material is selected appropriately according to a material, a size and the like of the protrusions and the roughness at the surface, while the plasma temperature is determined according to a material of the protrusions, roughness at the surfaces, adhesion strength and the like. The conditions for forming protrusions are selected to satisfy following conditions: (1) Temperature increase of the piezoelectric plate caused by a thermal spraying process is kept as low as possible. (2) A time needed for forming protrusions is short as much as possible. (3) A mechanical strength of the protrusions is large. (4) Roughness at surfaces of protrusions are controlled. (5) Precision of adhesion position of the protrusions is good, and a fine pitch if necessary can be realized. Though a thermal spraying process is used in the embodiment of the invention, other methods can be used if large melted particles can be deposited to form protrusions on the piezoelectric plate around a node of vibrations.

Because electrically conductive protrusions is formed at or near a node of vibrations of a piezoelectric plate and the piezoelectric plate is held at the protrusions, a contact area between the piezoelectric plate and a member for holding the piezoelectric plate is determined as the top area of the protrusions. The contact area can be controlled so as to have a prescribed value. Therefore, the area needed for holding a piezoelectric vibrator can be increased as much as possible by considering effects on the characteristics of the piezoelectric vibrator. Even if the means for holding the piezoelectric plate is displaced somewhat to the piezoelectric plate, the holding position is constant as to the piezoelectric plate. Therefore, the deterioration of the characteristics of the piezoelectric plate can be decreased while the stability and reliability of the characteristics of the piezoelectric plate can be improved. Because the protrusions also act as an electrical lead, a holding structure of piezoelectric vibrator can be made simpler.

EXAMPLE 1

Figure 5:
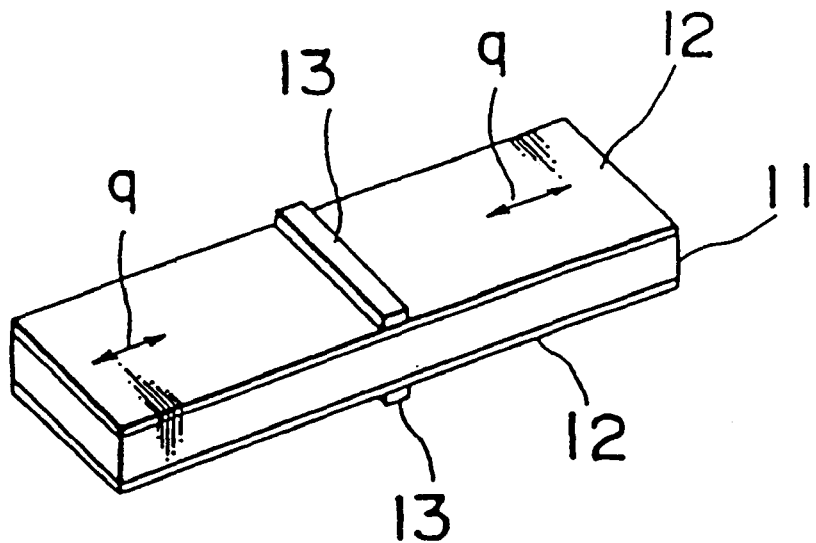
FIG. 5 is a perspective view of a piezoelectric vibrator element of a first example of the invention.

FIG. 5 shows a holding structure of a piezoelectric vibrator of a first example of the invention. A piezoelectric plate 11 is a rectangular plate made of a piezoelectric material such as a piezoelectric ceramic, quartz or lithium niobate, and electrodes 12 for driving the piezoelectric plate are formed on two opposing principal planes of the piezoelectric plate 11. When an alternating electric voltage is applied to the electrodes 12, longitudinal oscillations having principal replacement along a longitudinal direction of the piezoelectric plate 11 are generated as displayed with double arrows in FIG. 5.

A node line of the longitudinal oscillations is linear at a center of the rectangular plate 11. Protrusions 13 made of an electrically conductive material such as a metal or a ceramic are formed along the node line linearly with a thermal spraying process. In the thermal spraying process, minute particles of a metal, a ceramic or the like are melted and pass through a plasma at a high temperature, and the melted minute particles are blown with a gas stream onto a base to form a film of the particles. Therefore, a thick film can be formed on the substrate easily at a fast deposition rate.

Because a film formed with a thermal spraying process (called as sprayed film) is formed by continuous deposition of minute particles at high temperatures, adhesion strength between particles included in the film is strong. Further, though each particle to be deposited is melted at a high temperature, the heat capacity of the particle is small, while the particles are blown to the substrate along a gas stream. Therefore, it is a feature that temperature increase of the piezoelectric plate is very small if compared with a technique such as a soldering or welding.

The width and the thickness of the protrusions 13 are determined suitably by considering stable holding of the piezoelectric plate 11 and an effect on the characteristics of the piezoelectric plate 11 by taking the vibration resistance and shock resistance into account. It is desirable that the width and the thickness of the protrusions 13 are large to some extent in order to hold the piezoelectric plate 11 stably, while the width thereof is desirable to be smaller as to an aspect of the effect on the characteristics of the piezoelectric plate. Then, the width and the thickness of the protrusions 13 are determined appropriately by considering the two requirements to some extent.

This determination of the width and the thickness of the protrusion 13 is similar to the counterpart of prior arts. However, it is to be noted that the protrusions are formed with a thermal spraying process in the example. Because a protrusion is formed with a thermal spraying process, the protrusion can be stuck to the piezoelectric plate 11 at a sufficient adhesion strength without heating the piezoelectric plate 11. The temperature of the plate increases actually to a temperature sufficiently lower than about 130° C. which begins to cause characteristic deterioration as described on the prior art. Therefore, the temperature increase on forming the protrusions 13 is sufficiently lower if compared with prior art soldering technique, and effects on the characteristics of the piezoelectric plate is hardly recognized. Further, the protrusions can be formed easily as thick as 100 $\mu$m or more. Because the film as thick as 100 $\mu$m or more can be formed, the piezoelectric plate is not liable to contact with a holding means even if it is inclined to some extent. Then, the-characteristics of the piezoelectric plate can also be kept stable from this aspect.

It is required that the protrusion 13 is stable mechanically when a force for holding is applied and that the protrusion 13 has a stable electrical characteristic because it plays a role of an electrical lead for applying a driving voltage. Then, a material of the protrusion 13 can be determined appropriately by taking into account rust resistance, electrical conductance, elastic constant (hardness) and the like. The protrusion 13 is made of a material such as a metallic material such as a nickel-chromium alloy, a stainless steel alloy, molybdenum, brass, silver, a copper alloy or an aluminum alloy, or an electrically conductive ceramic.

Figure 6:
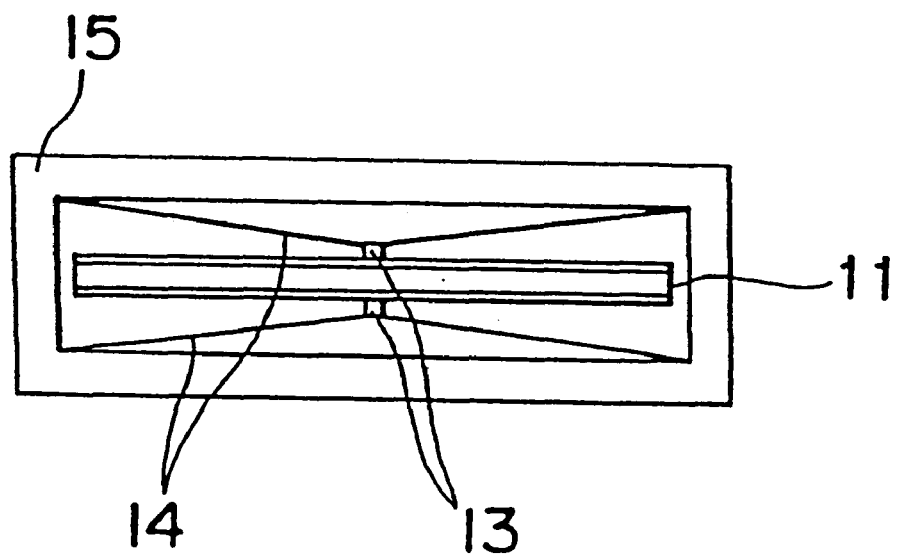
FIG. 6 is a sectional view of a holding structure for the piezoelectric vibrator shown in FIG. 5.

FIG. 6 is a sectional view along a longitudinal direction of an example of a holding structure for a piezoelectric plate 11 shown in FIG. 5. The piezoelectric plate 11 is held above and below at protrusions 13 formed at the center thereof with a thermal spraying process, by holders 14 having elastic properties and it is contained in a case (holding body) 15. The elastic properties of the holders 14 are useful in order to hold the piezoelectric plate 11 at a constant applied pressure and to buffer external shocks or the like to prevent the propagation of external forces from a case 15 to the piezoelectric plate 11.

For example, a leaf spring can be used for the holder 14 having plastic properties. A leaf spring is provided having a length longer suitably than the length of the inner space in the case 15, and as shown in FIG. 6, two ends thereof are set at two ends of the inner space so as for the leaf spring to be bent like an arch. A force applied to the piezoelectric plate above and below can be set at an appropriate value by designing elastic constants and size such as thickness and length appropriately.

The protrusions 13 formed with a thermal spraying process has a sufficient adhesion strength to the piezoelectric plate 11. It also has a sufficient mechanical strength which hardly causes elastic deforming when it is held by the holding members 14. Thus; the piezoelectric plate 11 can be held at the protrusions 13 so that it has good and reliable characteristics with small scattering.

If the leaf springs are made of an electrically conducting material such as a metallic thin plate, an electrical voltage can be applied to the piezoelectric plate 11 through the leaf springs. The piezoelectric vibrator is used as a component of an oscillator, a filter or the like. An alternating voltage is applied to the electrodes 12 of the piezoelectric plate 11 through electrically conducting holding members 14 or through a supply means such as electrical leads formed on the holding members 14 and then through the protrusions 13.

Figure 7:
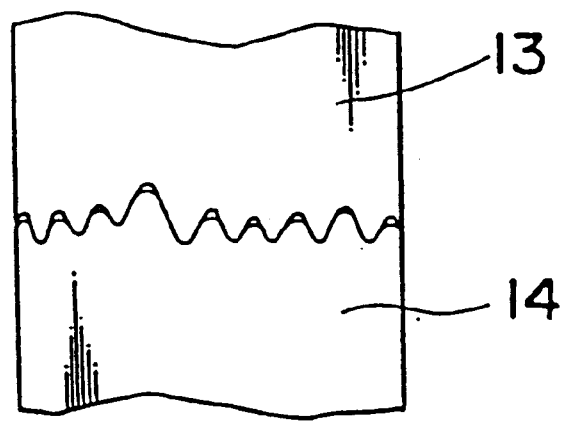
FIG. 7 is a partial view of a protrusion and a holding member.

Preferably, the protrusions 13 are made of a relatively hard metallic material such as a nickel-chromium alloy, a nickel-chromium-aluminum alloy or molybdenum or an electrically conductive ceramic material. The protrusions are formed to have minute roughness of a few to a few hundreds micrometers, preferably from a few tens to a few hundreds micrometers, at the surfaces thereof. Further, the holding members 14 are made of a material such as brass, a copper alloy, an aluminum alloy having a hardness smaller than the protrusions 13. In a contact state formed in such a condition of the protrusion 13 with a holding member 14, as shown in FIG. 7, the minute roughness at the surface of the protrusion 13 pierces into the surface of the holding member 14. This mechanical bonding realizes a stable holding of the piezoelectric plate 11 to reduce the effects of vibrations and shocks well. Further, an adhesion area of a protrusion 13 to the piezoelectric plate 11 can be reduced to an extent that the mechanical bonding between the piezoelectric plate 11 and the protrusion 13 is enhanced. This improves the characteristics of the piezoelectric plate 11.

Figure 8:
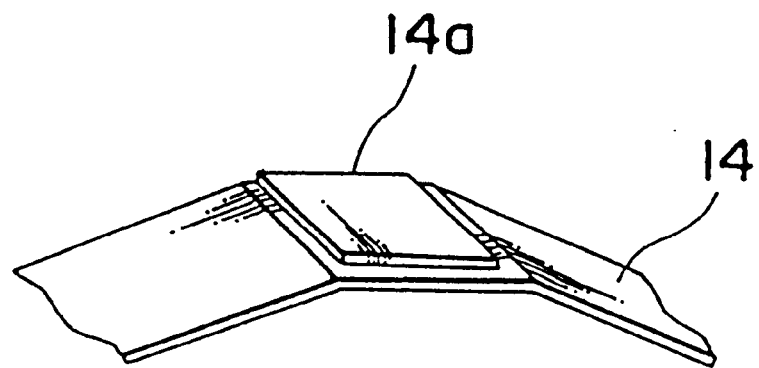
FIG. 8 is a partial perspective view of a holding member.

In the example described above, the leaf spring as a holding member of the piezoelectric plate is made of a material having a relatively low hardness such as brass, a copper alloy or an aluminum alloy. A similar advantage can be realized in a modified example shown in FIG. 8. In the example, the leaf spring is made of a material having a relatively high hardness such as a stainless steel or a spring steel, while an electrically conductive film 14a is formed on a contact portion of a holding member 14 by using a material having a hardness lower than the leaf spring such as brass, a copper alloy, an aluminum alloy, a lead alloy or a solder. Then, the roughness at the surface of the protrusion sticks into the electrically conductive film 14a.

An alternating voltage is applied to electrodes of the piezoelectric plate through the electrically conductive protrusions without using leads connected to the electrodes. The electrical conduction between the protrusions 13 to an electrical supplier provided externally is performed through the holder 14 made of an electrically conductive material or through an electrically conductive path formed along the holder 14.

In the example explained above, the protrusion is formed on an electrode for driving a piezoelectric plate. However, the electrode may be formed after the protrusion is formed on the piezoelectric plate.

Figure 9A:
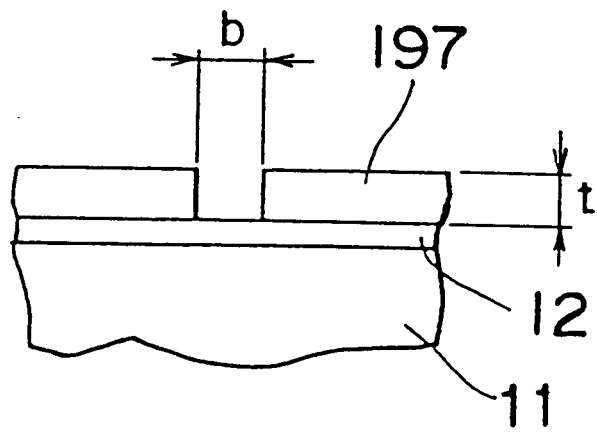
FIGS. 9A, 9B and 9C are sectional views of steps for illustrating an example of a manufacturing method of the holding structure of piezoelectric vibrator.

Next, an example of a method for forming the protrusions 13 shown in FIG. 5 is explained with reference to FIGS. 9A–9C. As shown in FIG. 9A, an electrode 12 is formed on a piezoelectric plate 11, and an organic resist mask 197 is formed on the electrode 12 with screening printing. The resist mask has an opening of width "b" and height "t". The resist mask 197 is made of an organic material because a sprayed film formed by thermal spraying process has a tendency hard to adhere to a relatively soft material such as an organic material. Secondly, the resist mask 197 can be separated and removed completely with an etchant or the like without giving damages to the electrode 12 and a protrusion 13.

Figure 9B:
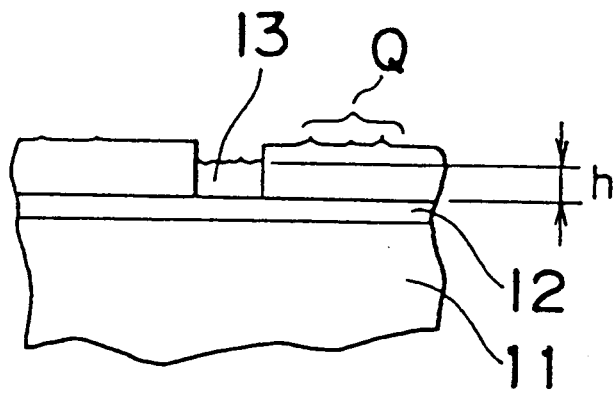

Next, as shown in FIG. 9B, the protrusion 13 is formed as a sprayed film in the opening formed in the resist mask 197 at a node from above with a thermal spraying process. The sprayed film has a height "h" equal to or lower than the thickness "t" of the resist mask 197. The sprayed film hardly adheres to the resist mask 197, and only sprayed particles adhere sparsely as shown schematically in section Q of FIG. 9B. Therefore, the sprayed film is deposited only in the opening.

Figure 9C:
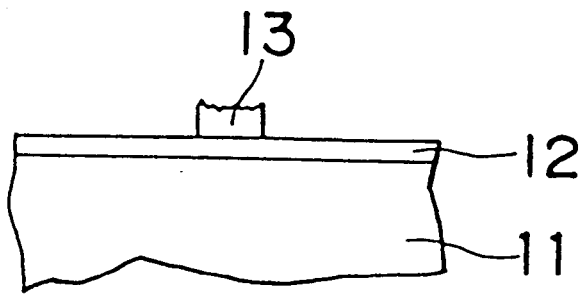

Finally, as shown in FIG. 9C, the resist mask 197 is removed with a resist etchant. The resist mask 197 is removed completely, and the sprayed film remains as the protrusion 13. The protrusion 13 has a shape with definite sides or has a shape similar to that of the opening. That is, the protrusion 13 can be formed to have almost same width at upper and lower portions. The protrusion 13 has a flat top surface though it has minute roughness. Therefore, the piezoelectric plate can be held not inclined against the holding member for holding it. It is also an advantage that a resist mask can be formed at a low cost.

Next, a modified example is explained wherein a protrusion 13 has a width "a" at an upper side smaller than "b" at a lower side. Such a protrusion is needed according to following reasons: First, the width or area of the protrusion at the bottom is preferably as narrow as possible in order to decrease effects on the vibrations of the piezoelectric plate. Second, the width or area of the protrusion is preferably as wide as possible in order to prevent the piezoelectric plate to be inclined to make contact with the external electrode or the like.

Figure 10A:
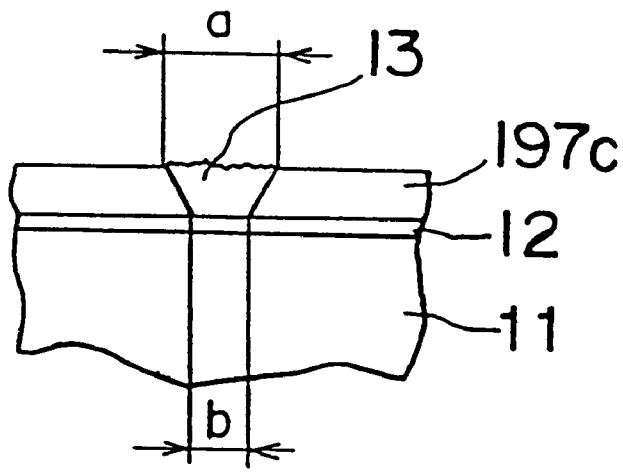
FIGS. 10A, 10B and 10C are sectional views of other examples of forming sprayed films.
Figure 10B:
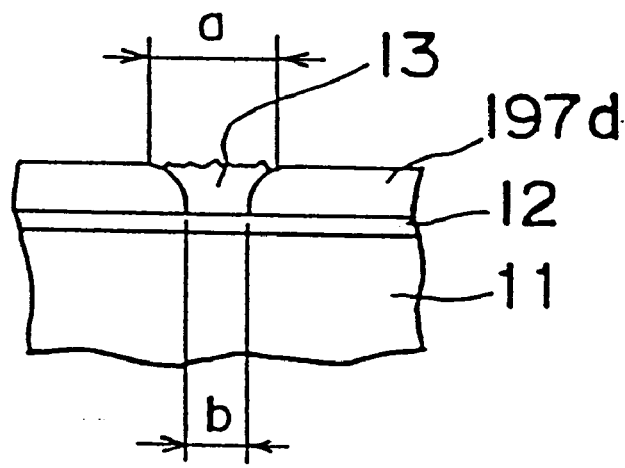
Figure 10C:
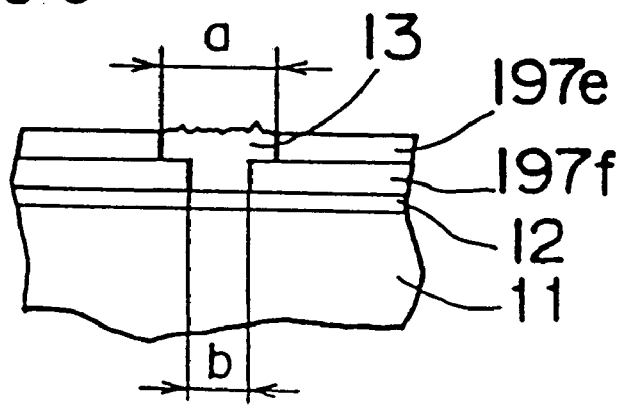

FIGS. 10A–10C show a step of three examples of a method of forming such a protrusion, in correspondence to a step shown in FIG. 9B in the example explained above. In the three examples, an electrode 12 is formed on a piezoelectric plate 11, and an organic resist mask is formed on the electrode 12 with screening printing. The resist mask has an opening having of width "a" at the top wider than "b" at the bottom. However, the shape of the opening is different among the three examples. In a first example shown in FIG. 10A, the slope of the opening formed in the resist mask 197c is constant. In a second example shown in FIG. 10B, a resist mask 197d has an opening having a slope decreasing gradually up to the top. In a third example, a resist mask is composed of two layers 197e and 197f, and the size of the opening is different in the two layers. Then, a sprayed film is deposited with a thermal spraying process in the opening to form a protrusion 13.

Figure 11A:
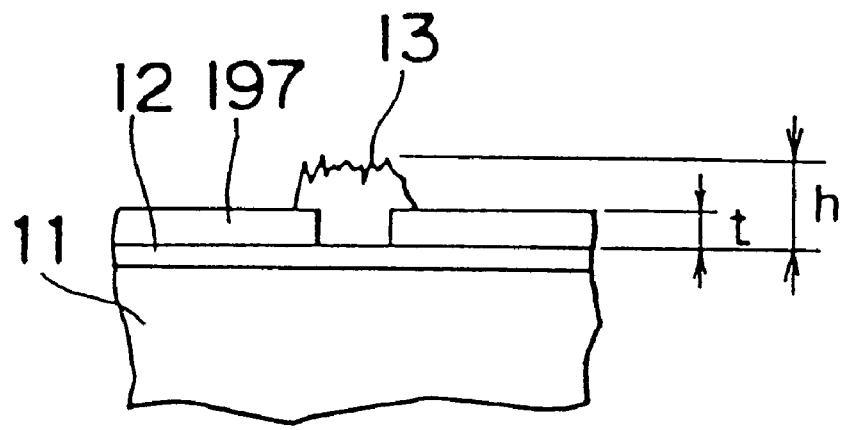
FIGS. 11A and 11B are sectional views of steps of a different method of forming a sprayed film.
Figure 11B:
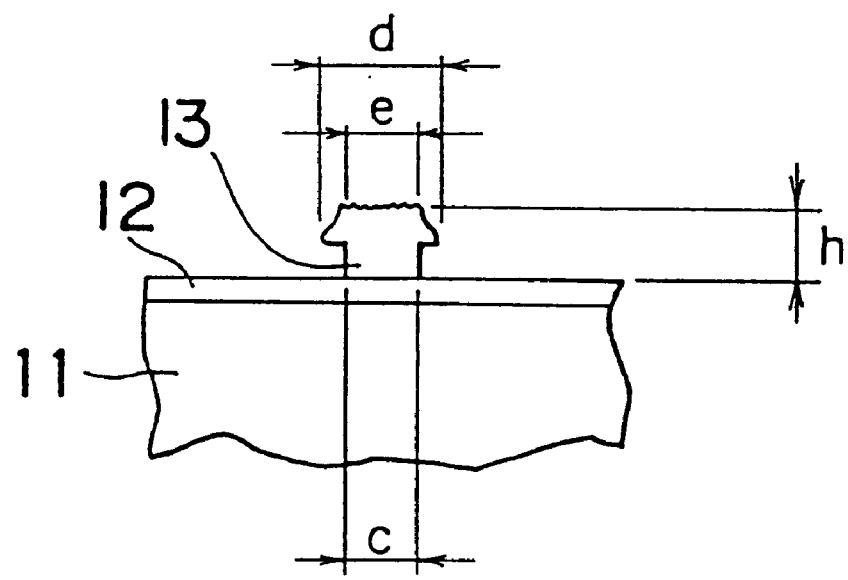

FIGS. 11A and 11B show steps of a modified example of a method of forming a protrusion 13 having a wider portion at the top. As shown in FIG. 11A, a sprayed film is deposited over the top of the opening formed in the resist mask 197. That is, the height "h" of the sprayed film or a protrusion 13 is higher than the thickness "t" of the resist mask 197, in contrast to FIG. 9B. Then, the protrusion 13 made of a sprayed film flows over the opening to have the height "h" larger than "t" as mentioned above and simultaneously to extend to a width "d" wider than the width "c" of the opening. The top of the protrusion 13 has a width "e" larger than "c". Because the sprayed film is hard to be adhered to the resist mask 197, the size "d" does not increase so extremely, but is suppressed to an appropriate extension. Thus, the protrusion having a larger width at the top and a smaller width at the bottom can be produced. Then, the resist mask 197 is removed with an etchant, as shown in FIG. 11B, to form the protrusion 13 having a wider width at the top on the piezoelectric plate 11. The resist ink used in the examples is a resist X87 of Taiyo Inki Seizo K.K. The resist is selected according to the width of the opening, the resist thickness, the resistance against heat and the like by considering that a sprayed film is hard to be adhered, that the resist film can be removed completely without causing damages to the electrodes 2, the protrusion 13 and the like and that the width and the thickness of the opening can be controlled to have desired values.

The resist mask may be made of a dry film or a photoresist. In this case, a pattern of an opening is formed with a photolithography process or the like.

Figure 12A:
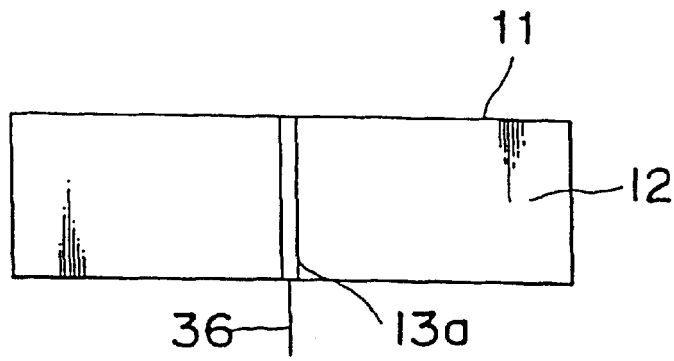
FIGS. 12A and 12B are top and bottom views of a piezoelectric vibrator with protrusions of different widths.
Figure 12B:
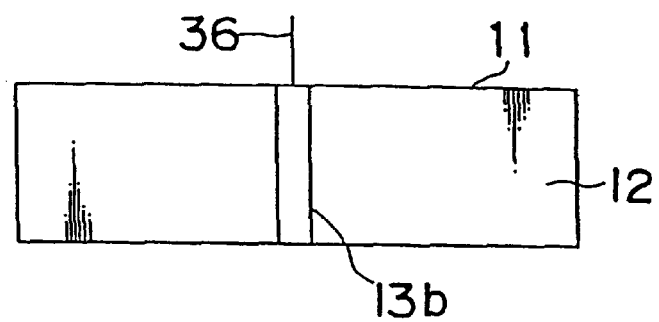

The sizes such as a width of the two protrusions 13a and 13b formed on opposing principal planes of the piezoelectric plate 11 may be different from each other as shown in FIGS. 12A and 12B, wherein reference numeral 36 denotes a position of a node line. In this example, the two protrusions 13a and 13b have widths different from each other. Then, the piezoelectric plate 11 can be held stably with protrusions of a smaller area than a holding structure using protrusions with the same width.

The protrusions 13a and 13b extend along a whole width of the piezoelectric plate 11. However, even if they are formed along a part of the whole width thereof, similar effects can be realized.

Figure 13A:
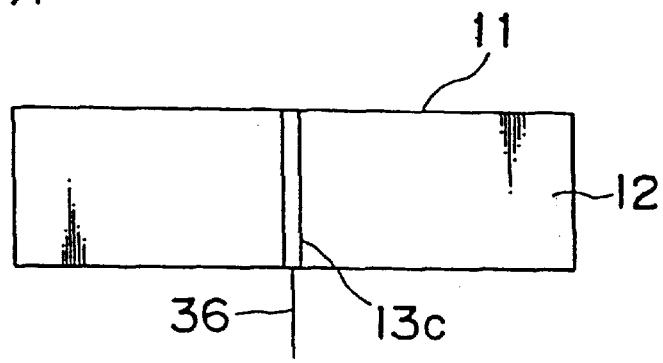
FIGS. 13A and 13B are top and bottom views of a piezoelectric vibrator with three protrusions.
Figure 13B:
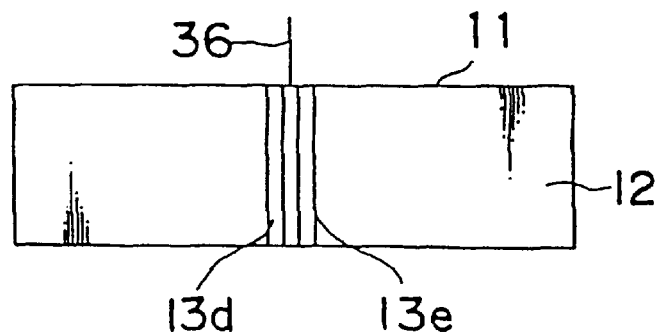

The number of protrusions 13 is not limited to two. FIGS. 13A and 13B show an example wherein three protrusions 13c, 13d and 13e are formed on two principal planes of the piezoelectric plate 11. One protrusion 13c is formed on a principal plane along a node line as shown in FIG. 13A, while two protrusions 13d and 13e are formed on the other principal plane near the node line. In this example, the piezoelectric plate 11 can be held stably with protrusions of a smaller area than a holding structure using two protrusions to have less effects on the characteristics of the piezoelectric plate.

EXAMPLE 2

Figure 14:
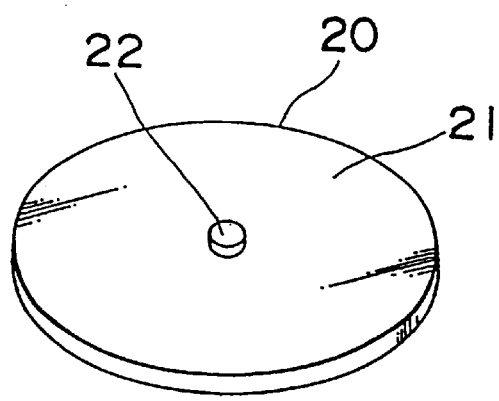
FIG. 14 is a perspective view of a disk-like piezoelectric vibrator.

FIG. 14 shows a disk-like piezoelectric vibrator of a second example of the invention. Electrodes 21 are formed on two opposing principal planes of a disk-like piezoelectric plate 20, and when an alternating voltage is applied to the electrodes 21, vibration modes having a main displacement along radial directions can be generated in the disk-like piezoelectric plate 20.

A node of the vibrations is located at a center point of the disk-like piezoelectric plate, and electrically conductive protrusions 22 made of a metal or a ceramic are formed on the two electrodes 21 at the node point with a thermal spraying process. A contact area of the protrusion 22 with the piezoelectric plate 20 is determined so as to hold the piezoelectric plate stably against vibrations and shocks and to have small effects on the characteristics of the piezoelectric plate 20. Generally, the area is 1/60–1/20 of the area of the piezoelectric plate 20.

Figure 15:
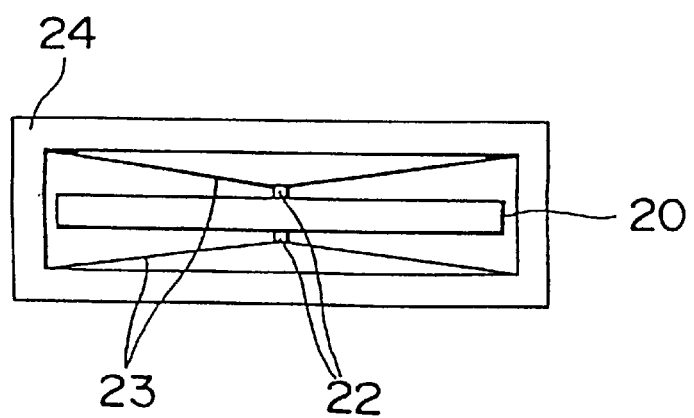
FIG. 15 is a sectional view of a holding structure for the piezoelectric vibrator shown in FIGS. 12A and 12B.

FIG. 15 shows a holding structure of the piezoelectric plate 20. The piezoelectric plate 20 is held above and below at protrusions 22 formed at the center thereof with a thermal spraying process, by holding members 23 having elastic properties, and it is contained in a case (holding body) 24. The plastic properties of the holding members 23 are useful in order to hold the piezoelectric vibrator 20 at a constant applied pressure and to buffer external shocks and the like to prevent the propagation of external forces from the case 24 to the piezoelectric plate 20.

In the first and second examples explained above, because electrically conductive protrusions are formed around nodes of vibrations of the piezoelectric plate with a thermal spraying process, mechanical quality coefficients $Q_n$ and coupling coefficients of the piezoelectric plate remain large and the protrusions are strong mechanically. Then, a contact area between the piezoelectric plate and the holding member is determined by a top area of the protrusion and it is kept almost constant. Therefore, an area needed for holding the piezoelectric plate can be increased by considering the effects on the characteristics of the piezoelectric plate. Further, because the protrusions are formed on the piezoelectric vibrator, even if the holding member is displaced relative to the piezoelectric vibrator, the holding position is kept at the same position for the piezoelectric vibrator. Then, the characteristic of the piezoelectric vibrator remains constant and the piezoelectric vibrator can be held reliably and stably. Still further, because the protrusions also act as electrical leads for supplying an electrical voltage to the piezoelectric plate, an oscillator, a filter or the like can be constructed easily.

EXAMPLE 3

Figure 16A:
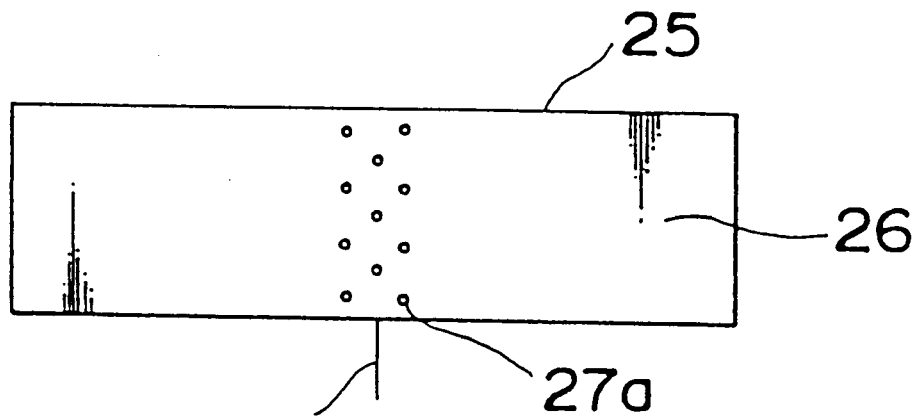
FIGS. 16A and 16B are a top view and a bottom view of an example of a piezoelectric vibrator of a rectangular plate of a third example of the invention.
Figure 16B:
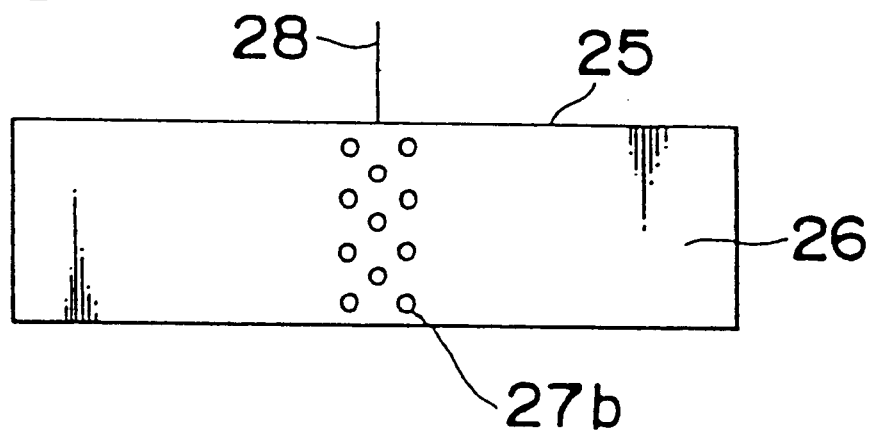

FIGS. 16A and 16B show a piezoelectric vibrator of a third example of the invention including a plate 25 of a rectangular plate made of a piezoelectric material such as a piezoelectric ceramic, quartz or lithium niobate. Electrodes 26 for driving the piezoelectric plate are formed on two opposing principal planes of the piezoelectric plate 25. When an alternating electric voltage is applied to the electrodes 26, longitudinal oscillations having principal replacement along a longitudinal direction of the piezoelectric plate 25 are generated. A node of vibrations of the longitudinal oscillations is linear at the center of the piezoelectric plate 25. As shown in FIG. 16A, point-like protrusions 27a made of a nickel alloy, a nickel-chromium alloy, molybdenum or the like are formed around the node designated with reference number 28 with a photolithography process and a thermal spraying process. They are aligned in three rows, and each of them have a certain area. As shown in FIG. 16B, protrusions 27b are formed similarly around the node on the opposite principal plane of the piezoelectric vibrator 25, and they have areas larger than those of the protrusions 27a.

Similarly to examples 1 and 2, the piezoelectric plate 25 is held above and below at the protrusions 27a, 27b by using holding members having elastic properties, and it is contained in a case. By controlling the size of the protrusions 27a, 27b provided on the two principal planes, the piezoelectric plate 25 can be held stably with smaller contact areas if compared with a piezoelectric plate having protrusions with same sizes. Thus, the piezoelectric plate can be held more stably and more reliably and have small effects on the characteristics of the piezoelectric plate.

In the example shown in FIGS. 16A and 16B, the protrusions have circular shape at the top thereof. However, a different shape such as a triangle, a square or a ring also act similarly for holding the piezoelectric plate with the holding members. It is also to be noted that protrusions formed on a piezoelectric plate having a contour other than a rectangle, such as a square shape or a circular shape or using expansion vibration mode also operate similarly. Though the example uses a rectangular piezoelectric plate, it is understood that protrusions can also be formed on a piezoelectric plate of a shape other than a rectangle such as a square or a circle and similar advantages can be realized on the characteristics of the piezoelectric plate.

EXAMPLE 4

Figure 17A:
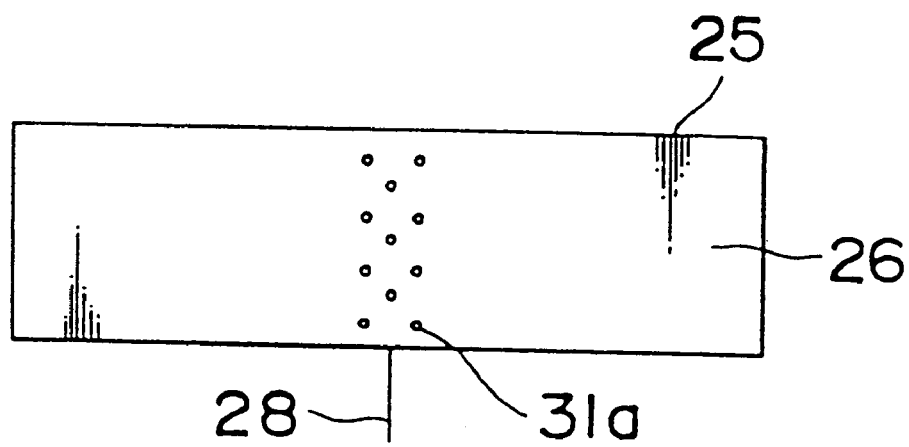
FIGS. 17A and 17B are a top view and a bottom view of a piezoelectric vibrator of a rectangular plate of another example of the third example.
Figure 17B:
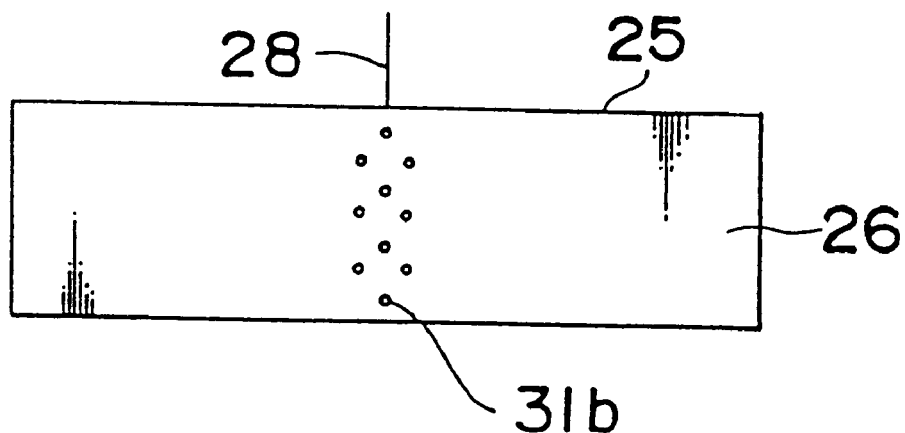

FIGS. 17A and 17B show a piezoelectric plate 25 of a rectangular plate of a fourth example. This example is same as the third example except that the arrangement of protrusions 31a formed on electrodes 26 applied to a principal plane of the piezoelectric plate 25 are different from that of protrusions 31b formed on the other principal plane. That is, the positions of the protrusions 31b are set so as not to coincide with those of the counterpart protrusions 31a.

Similarly to the third example, the protrusions have a different shape, other than a circle, such as a triangle, a square or a ring also act similarly for the holding of the piezoelectric vibrator with the holding members. It is also to be noted that protrusions formed on a piezoelectric vibrator having a contour other than a rectangle, such as a square shape or a circular shape, or using expansion vibration mode also act similarly.

EXAMPLE 5

Figure 18:
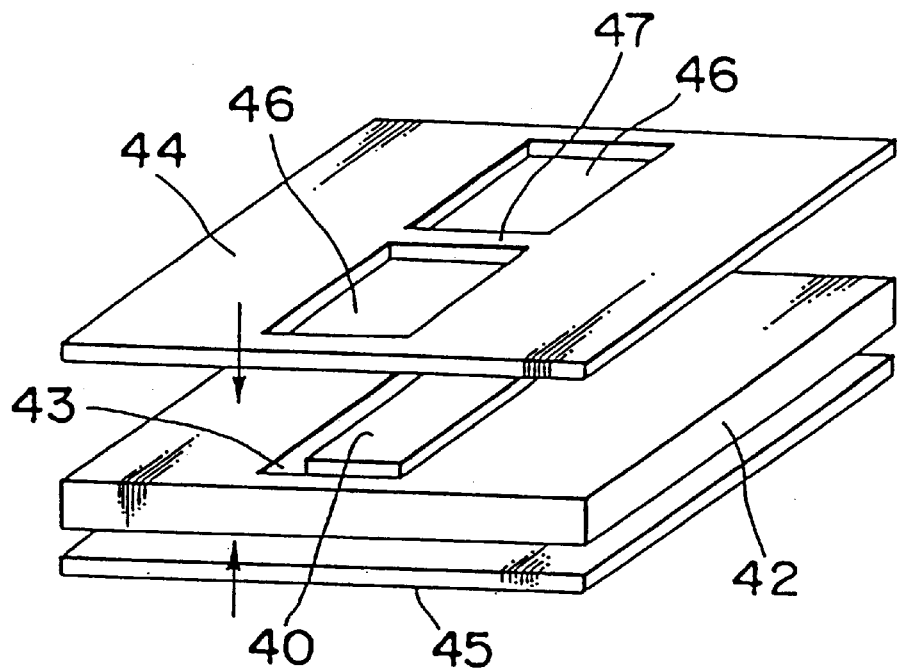
FIG. 18 is a perspective view of a fifth example of the invention.

FIG. 18 shows a perspective view of a holding structure of a piezoelectric vibrator of a fifth example. A reference numeral 40 denotes a piezoelectric plate of a rectangular shape shown in FIG. 5. The piezoelectric element 40 has two liner protrusions 13 formed on the two principal planes thereof. A spacer 42 is made of a plate of a plastic material or the like and it has a large opening 43 having a size somewhat larger than the periphery of the piezoelectric plate 40. The piezoelectric element 40 can be placed easily by inserting it in the opening 43 of the spacer 42 without contact therewith. Then, the piezoelectric element 40 is interposed between two printed circuit boards 44 and 45 with a certain force as shown by the arrows in FIG. 18. The boards 44, 45 also have openings 46 in correspondence to the opening 43 but they have a bridge portion 47 in correspondence to the linear protrusions 13. For electrical conduction through the protrusions 13, electrode patterns of copper foils 48, 49 are provided on the bridge portion 47 in planes to make contact with the protrusions 13.

Figure 19:
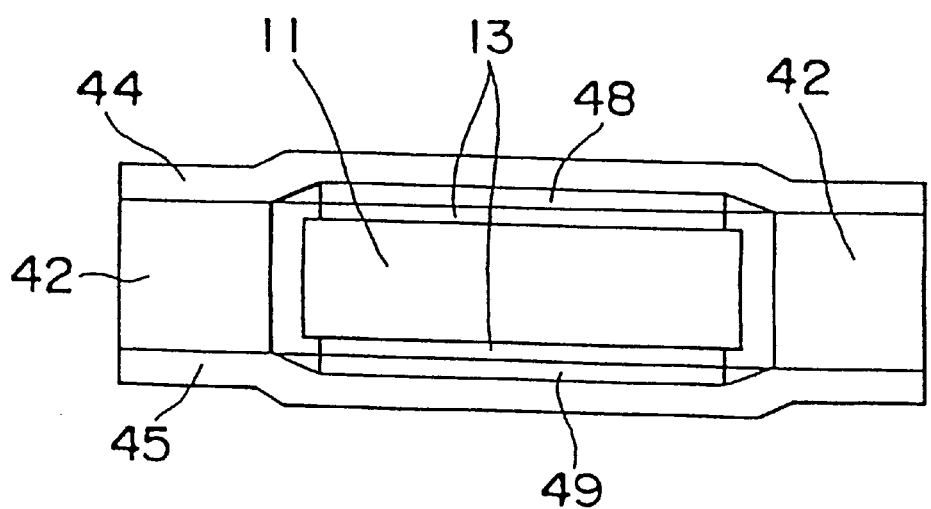
FIG. 19 is a sectional view of the holding structure shown in FIG. 18 in the width direction along the bridge portion.

FIG. 19 shows a section of the holding structure shown in FIG. 18 in the width direction along the bridge portions 47. It is shown that the piezoelectric plate 11 is held at the protrusions 13 by the printed circuit boards 44 and 45. The thickness of the spacer 43 is determined so as to hold the piezoelectric element 40 with an appropriate force by taking into account flexural rigidity and flexure quantity of the printed circuit boards 44, 45. Electrodes for driving the piezoelectric plate 11 are connected to the copper foils 48, 49. Though the example uses a rectangular piezoelectric plate, it is understood that a similar holding structure can also be used for a piezoelectric plate of a shape other than a rectangle such as a square or a circle for expansion vibrations or a flexure oscillator and causes similar advantages on the characteristics of the piezoelectric plate.

As explained above, the shape of the holding structure of the fifth example is designed to hold the piezoelectric plate stable at the protrusions. However, it is possible to hold the piezoelectric plate only by using the copper foils 48, 49 stably without forming openings in the printed circuit boards 44, 45.

EXAMPLE 6

Figure 20:
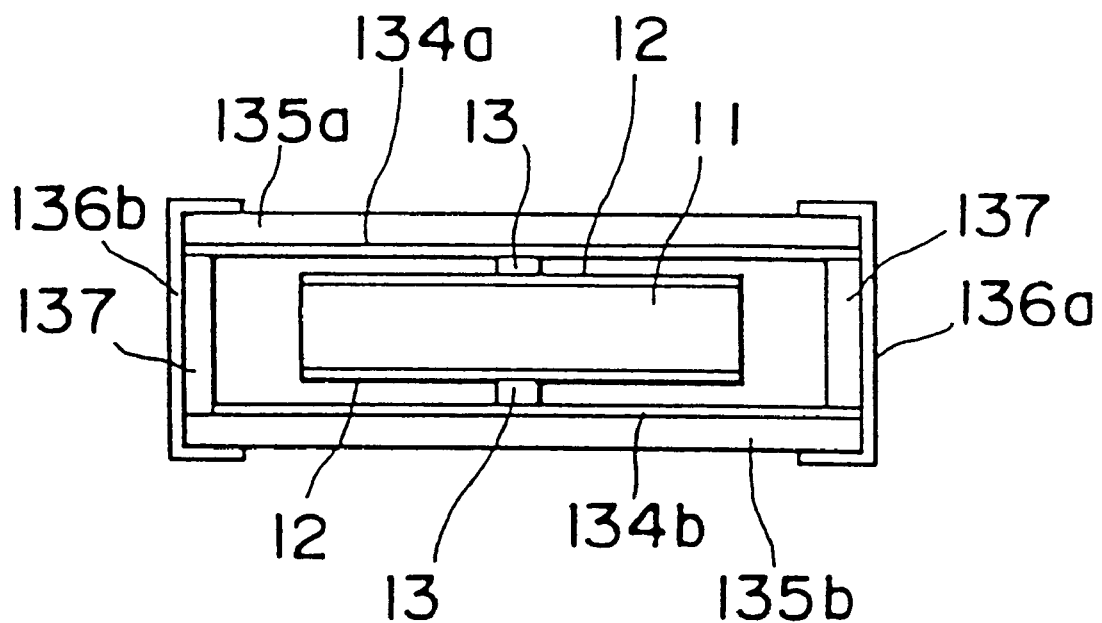
FIG. 20 is a sectional view of a holding structure in the longitudinal direction.

FIG. 20 shows a perspective view of a holding structure of a piezoelectric plate shown in FIG. 5. Suffixes "a" and "b" of reference numerals denote top side and bottom side, respectively. External electrodes 134a and 134b are formed on holding plates 135a and 135b, and the two protrusions 13 are contacted with and interposed by the two external electrodes 134a, 134b or by the two rectangular holding plates 135a, 135b. The plate 135a, 135b are fixed with a frame 137 provided at the periphery of the plates 135a, 135b. External terminals 136a and 136b are formed on two sides of the periphery of the frame 137 as shown in FIG. 20 and make contact electrically with the external electrodes 134a and 135b, respectively.

Figure 21:
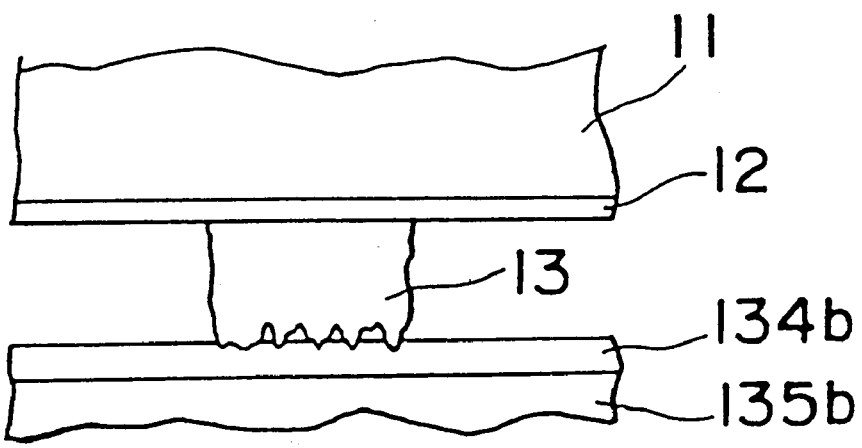
FIG. 21 is a partial view of the holding structure around a protrusion.

FIG. 21 shows a partial view of the holding structure around the protrusions 13. The bottom of the protrusion 13 adheres to the electrode 12, while the top thereof sticks into the external electrode 134b as illustrated by the minute roughness in FIG. 21 schematically. Thus, the piezoelectric plate is held surely between the holding plates 135a, 135b, while the electrical conduction are kept surely between the external electrodes 136a, 136b and the driving electrodes 12.

Figure 22A:
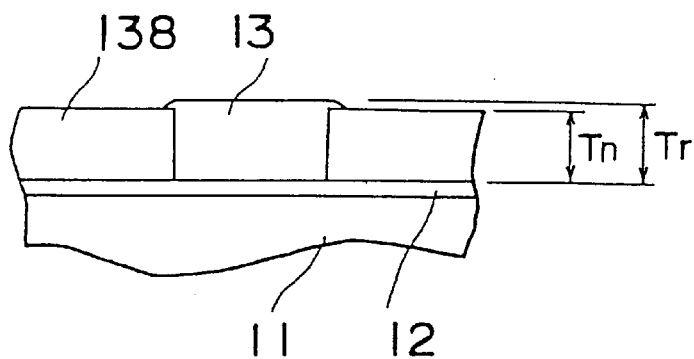
FIGS. 22A, 22B and 22C are sectional views of manufacturing steps of a holding structure of piezoelectric vibrator successively.

Next, a manufacturing method of the holding structure is explained with reference to FIGS. 22A–22C. As shown in FIG. 22A, a resist mask 138 for patterning a protrusion is formed first on a plane of a piezoelectric vibrator plate 11 on which an electrode 12 is formed for driving. The resist mask 138 has an opening patterned along a node of the piezoelectric plate 11. A film is formed in the opening with a spraying process by using a metal such as molybdenum, nickel or chromium or an alloy thereof or a composite material to form a protrusions 13. The protrusion 13 is formed on each of the principal planes of the piezoelectric plate 11.

Figure 22B:
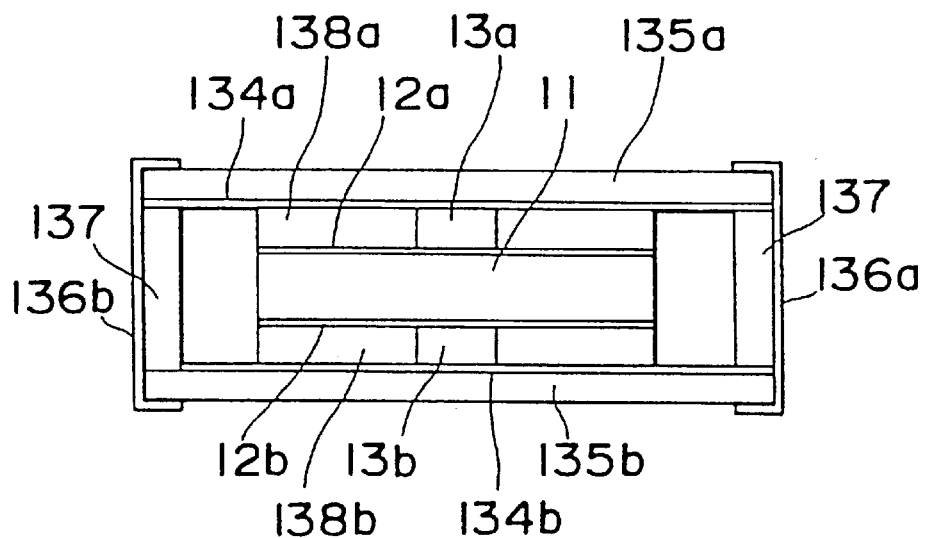
Figure 22C:
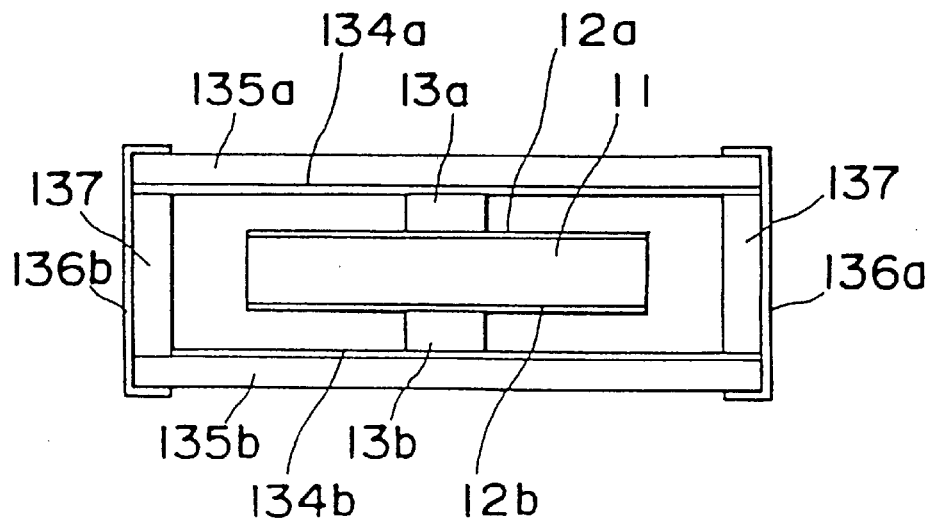

Next, as shown in FIG. 22B, a frame 137 is put on a holding plate 135b on which an external electrode 134b is formed, and on a prescribed position on the holding plate 135b as constructed above, a piezoelectric plate 11 is put via the protrusion 13 and the resist mask 138b. Then, another holding plate 135a with another external electrode 134a is placed thereon. Then, the holding plates 135a and 135b are fixed to a frame 137 with an adhesive agent or the like, while holding the piezoelectric vibrator in a prescribed position. In this state, because the resist mask 138 are formed on the piezoelectric plate 11, it does not contact with the external electrodes 134a, 134b directly even if they are inclined or displaced somewhat on fixing. Next, as shown in FIG. 22C, after constructing the piezoelectric plate 11 and the holding plates 135 as described above, the resist masks 138a, 138b are removed. Therefore, the piezoelectric plate can be located and fixed at a normal position against the holding plates 135a, 135b, the frame 137 and the like.

Because the piezoelectric plate 11 is held by the holding plates 135a, 135b in the same state before removing the resist masks 138, it does not make contact with the external electrodes 134, the holding plates 135, the frame 137 or the like. Therefore, the characteristics of the piezoelectric plate is improved and the stability thereof is also improved. Further, the construction and the adjustment can be performed efficiently to improve the productivity of a holding structure of piezoelectric vibrator.

Next, the thickness $T_r$ of the resist masks 138 and the thickness $T_n$ of the protrusions 13 are explained with reference to FIG. 22A. In FIG. 22A, $T_r<T_n$. In concrete, a difference between $T_r$ and $T_n$ is set to be about 5–30 μm. Then, in the state shown in FIG. 22B, there exists gaps between the external electrodes 134a, 134b and the resist masks 138a, 138b, and an etchant liquid for removing the resist masks 138a, 138b is likely to penetrate through the gaps to make it easy to release them. Further, because $T_r<T_n$, the protrusions 13 make contact with the external electrodes 134a, 134b surely.

The external electrodes 134 are made of copper having a hardness less than that of the protrusions 13, while the protrusions 133 have rough surfaces. Therefore, the roughness sticks into the external electrodes 134a, 134b, so that sure holding and sure electrical contact can be realized.

The resist mask 138 are made of a resist which can be patterned with a photolithography process and can be dissolved or softened and removed with a releasing liquid used exclusively therefor. For example, a dry film photoresist of odil a, AFOO or BF is available from Tokyo Oka Kogyo KK. It is needed to provide a gap sufficiently large enough for the liquid to pass or to keep the resist mask from catching the holding plates 135, the frame 137 or the like during removal. Therefore, the liquid preferably dissolves the resist mask 138. For example, a liquid of PMER P-AR 9000 is available from the Tokyo Oka Kogyo KK. The resist mask 138 may be formed with screening printing. In this case, a soluble etching resist ink X-87 or M-85 of Taiyo Inki Seizo KK may be used.

A resist material is selected by considering following conditions: Corrosion, erosion or the like is not cause by a development agent or a removing liquid on the piezoelectric plate 11, the driving electrodes 12, the external electrodes 134, the holding plates 135, and the frame 137 or the like. A required thickness can be obtained easily. If a resist material is made of an organic material mainly and it satisfies the above-mentioned conditions, it can be used for forming the protrusions 13 besides the above-mentioned examples.

Figure 23A:
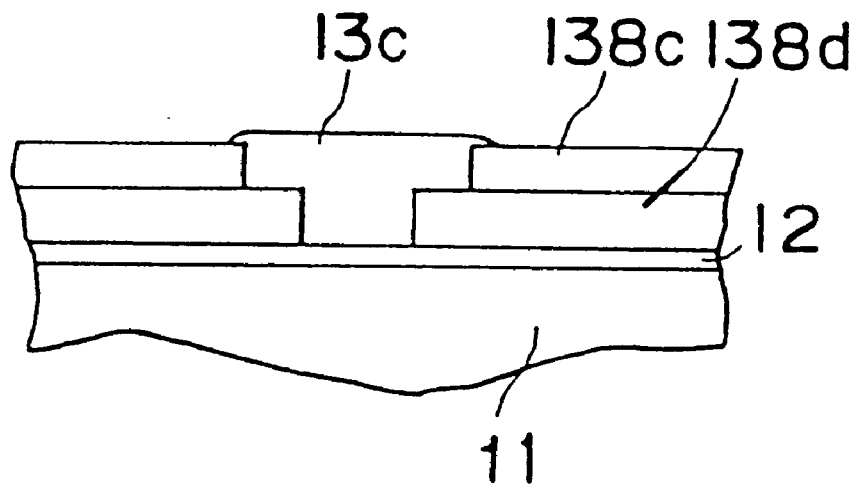
FIGS. 23A and 23B are sectional views of a multilayer resist mask.
Figure 23B:
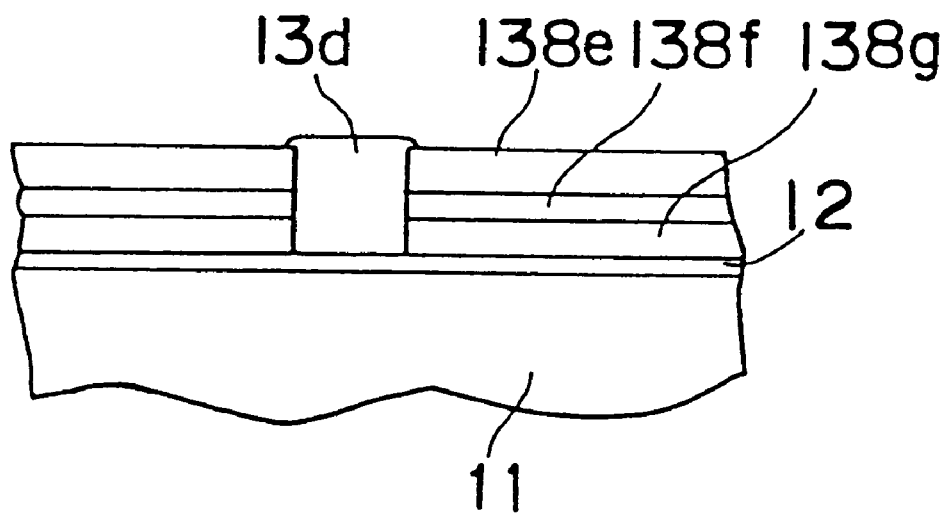

A resist mask of a thickness of 30 μm or more in correspondence to the thickness of the protrusions 13 can be formed with a resist film. However, if an ink type resist is used, a resist mask can be made thick by providing a multi-layer resist. In an example shown in FIG. 23A, a resist mask is formed with two resist layers 138c and 138d, and an opening in the top layer 138c is larger than that in the bottom layer 138d. In another example shown in FIG. 23B, a resist mask is formed with three resist layer 138e, 138f and 138g, but with opening of the same size in the three layers. Then, a protrusions 13c, 13d are formed in the openings. The top layers 138c, 138e are made of a soluble resist. Then, after the top layers 138c, 138e are dissolved, the gap is widened, and the liquid passes easily. Then, the lower resists 138d, 138f and 138g can be removed easily. A similar advantage can be realized if at least one layer in a multi-layer resist mask is made of a soluble resist.

EXAMPLE 7

If an electrode for driving a piezoelectric plate is formed not along a whole width of a piezoelectric vibrator, but along a part of the whole width and polarization of the piezoelectric plate is performed by applying a voltage through the electrode, polarization is not generated in a portion on which the electrode is not formed. Then, imbalance of internal stress occurs inside the piezoelectric plate at an interface between the above-mentioned portion and the other portion, and this may cause cracking in the piezoelectric plate.

Figure 24:
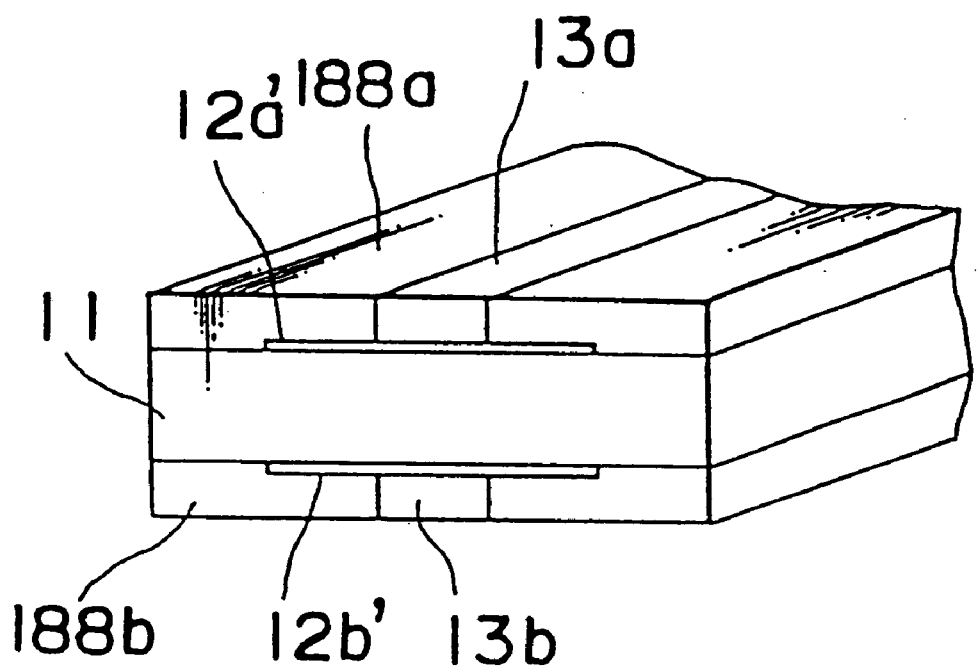
FIG. 24 is a perspective view of a piezoelectric vibrator element.

A seventh example of the invention solves this problem on the polarization. As shown in FIG. 24, electrodes 12a' and 12b' are formed on a piezoelectric plate 11 partly in the width direction. Then, before forming protrusions 13a, 13b, electrically conductive resist mask 188a, 188b are formed on the whole principal planes except openings for protrusions. Next, the protrusions 13a, 13b are formed in the openings. The piezoelectric plate 11 is polarized with the use of the electrically conductive resist mask 188. Thus, the piezoelectric plate 11 can be polarized completely, including the portion on which the electrode 12a', 12b' are not formed. Because the polarization occurs uniformly inside the piezoelectric plate 11, no imbalance of internal stress is generated. That is, the above-mentioned problem is solved, and the characteristics of a piezoelectric plate is improved and the yield of a piezoelectric vibrator is improved. Next, the piezoelectric vibrator produced as described above is constructed as shown in FIG. 20 with the plates 135a, 135b and the like. Alternately, a piezoelectric vibrator obtained as described above is cut off by a portion on which the electrode 12a' and 12b' are not formed, and it is used to construct a structure shown in FIG. 20.

The protrusion 13 may be formed after the polarization of the piezoelectric plate 11 as described above. However, though the protrusion 13 is formed with a thermal spraying process which causes a gradual temperature increase, the temperature of the piezoelectric plate 11 increase somewhat. Therefore, it is preferable to cause polarization after forming the protrusions 13.

The resist masks 188a, 188b are made of a liquid resist material including a prescribed quantity of silver as electrically conductive material, but they may be made of a material which is electrically conducting, hard for a sprayed film to adhere to and can be subjected to patterning easily. The piezoelectric plate 11 itself is an insulator and has a high specific resistivity. Further, the resist mask 188 has a thickness narrower than the piezoelectric plate 11. Therefore, it is preferable that the specific resistivity of the resist masks 188 are smaller than that of the piezoelectric plate 11 by three digits. Then, an electrically conductive component is controlled to provide a specific resistivity which is equal to or below the above-mentioned condition. However, if the added quantity of the electrically conductive material is too large, characteristics such as patterning and elasticity are deteriorated. In such a case, it is added to an order about 1 mΩ·cm. The electrically conductive material may be a metal such as gold, nickel or molybdenum, an alloy thereof, a compound such as an carbide, a boride or an oxide, having an appropriate electrical conductance.

EXAMPLE 8

Figure 25:
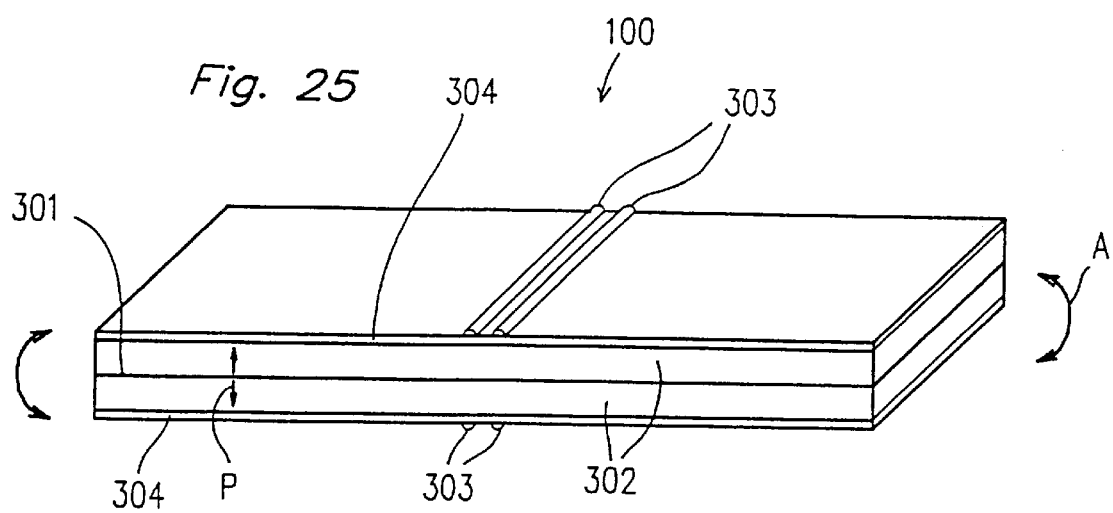
FIG. 25 is a perspective view of a piezoelectric vibrator for constituting an acceleration sensor according to an example of the present invention.

FIG. 25 is a perspective view of a piezoelectric vibrator 100 constituting an acceleration sensor according to an example of the present invention. The piezoelectric vibrator 100 shown in FIG. 25 includes, as a piezoelectric element, a bimorph piezoelectric element 301 formed by attaching two plates made of a piezoelectric material, e.g. piezoelectric ceramic plates 302, to each other. An electrode 304 is formed on each of the opposed principal surfaces of the piezoelectric ceramic plates 302 Protrusions 303 made of molybdenum, nichrome, or the like are linearly formed on the respective electrodes 304 in the central portions of the opposed surfaces of the bimorph piezoelectric element 301 by a thermal spraying process. In this example, two linear protrusions 303 are provided on each surface of the bimorph piezoelectric element 301 in order to support the bimorph piezoelectric element 301 stably. In this case, the width and the thickness of the respective protrusions 303, and the gap between the two protrusions 303 formed on each surface are determined so that the protrusions 303 support the bimorph piezoelectric element 301 stably in view of the vibration-resistance and the impact-resistance thereof, and the effect to be given to the characteristics of the bimorph piezoelectric element 301. In this example, the width of one linear protrusion is set to be 0.2 mm; the gap between the pair of protrusions is set to be 0.3 mm: and the thickness is set to be 0.1 mm. The protrusions 303 are required to be mechanically stable even under the supporting force, and to exhibit constant electrical properties for functioning as the lead lines. Therefore, the material for the protrusions 303 is selected in consideration of the electrical conductivity, the elastic modules (or the hardness), and the rust-resistance thereof.

In this example, a piezoelectric ceramic plate with a length of 5 mm, a width of 0.7 mm, and a thickness of 0.1 mm is used as each piezoelectric ceramic plate 302. Accordingly, the thickness of the bimorph piezoelectric element 301 becomes 0.2 mm. In order to generate a flexural vibration (bending vibration) effectively, it is preferable to set the length L of the bimorph piezoelectric element to be 3.5 times as long as the width W thereof or longer, more preferably, 5 times as long as the width or longer. The protrusions 303 are preferably formed in the vicinity of the central portions of the bimorph piezoelectric element 301 in the longitudinal direction, and preferably disposed symmetrically to the center line in the longitudinal direction. The number and the positions of the linear protrusions may be different on the two surfaces of the bimorph piezoelectric element. However, it is preferable that the numbers and the positions of the protrusions are same on both of the two surfaces.

Figure 35A:
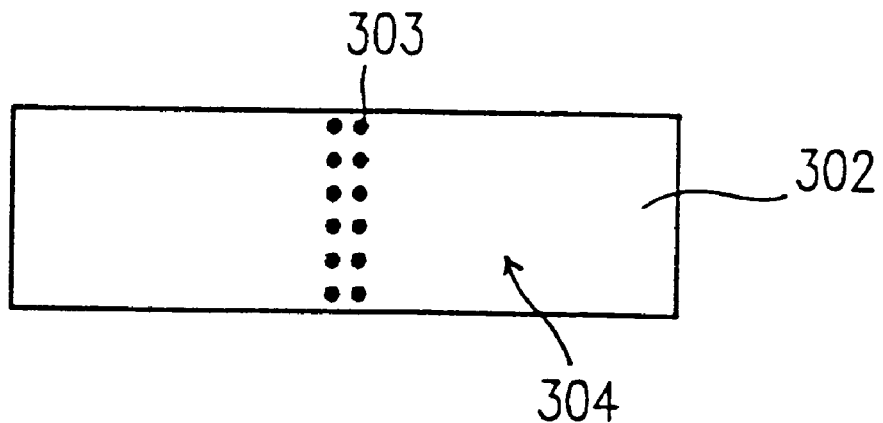
FIGS. 35A and 35B are plan views of alternative dispositions of the protrusions to be formed on a piezoelectric vibrator according to other examples of the present invention.
Figure 35B:
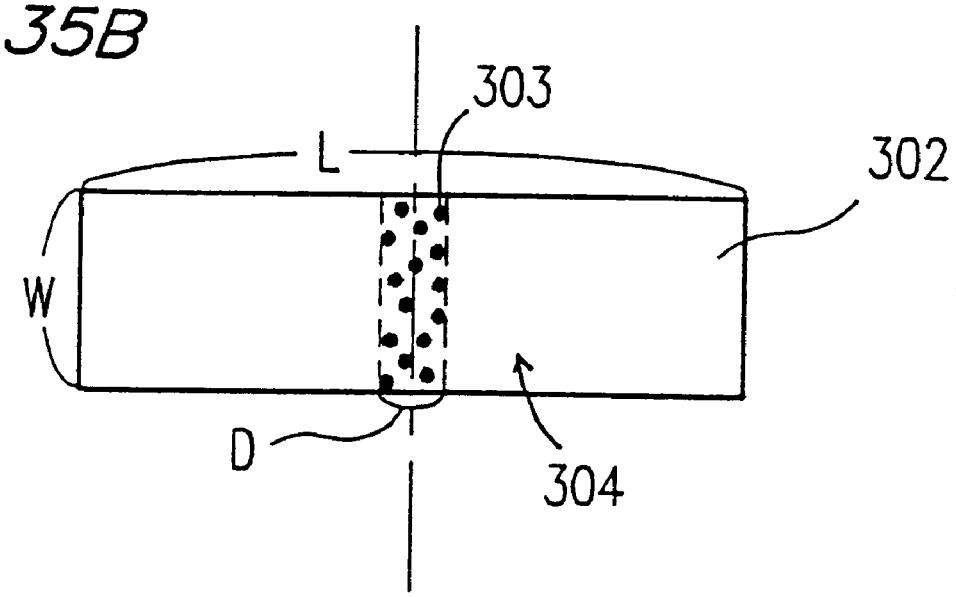
Figure 36:
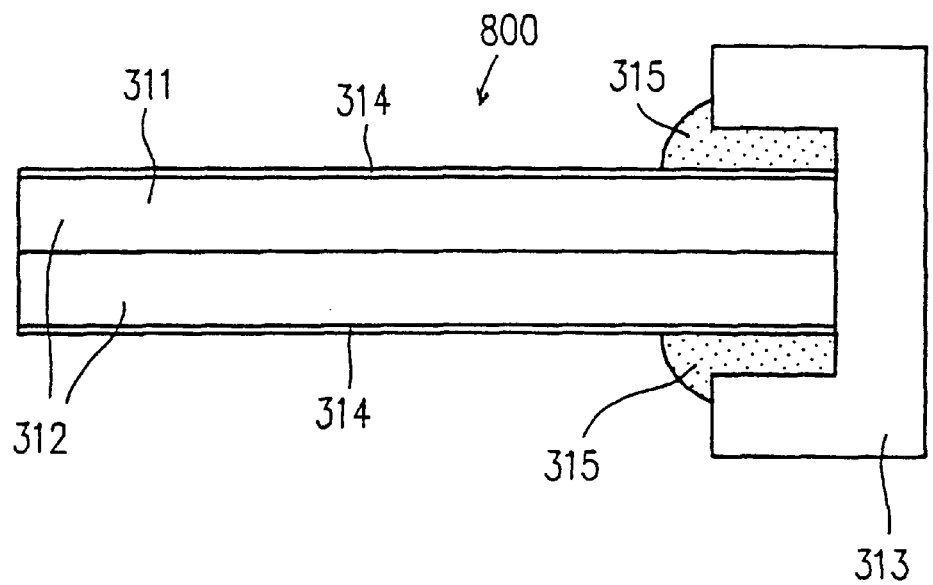
FIG. 36 is a cross-sectional view showing a structure for a conventional acceleration sensor.
Figure 37:
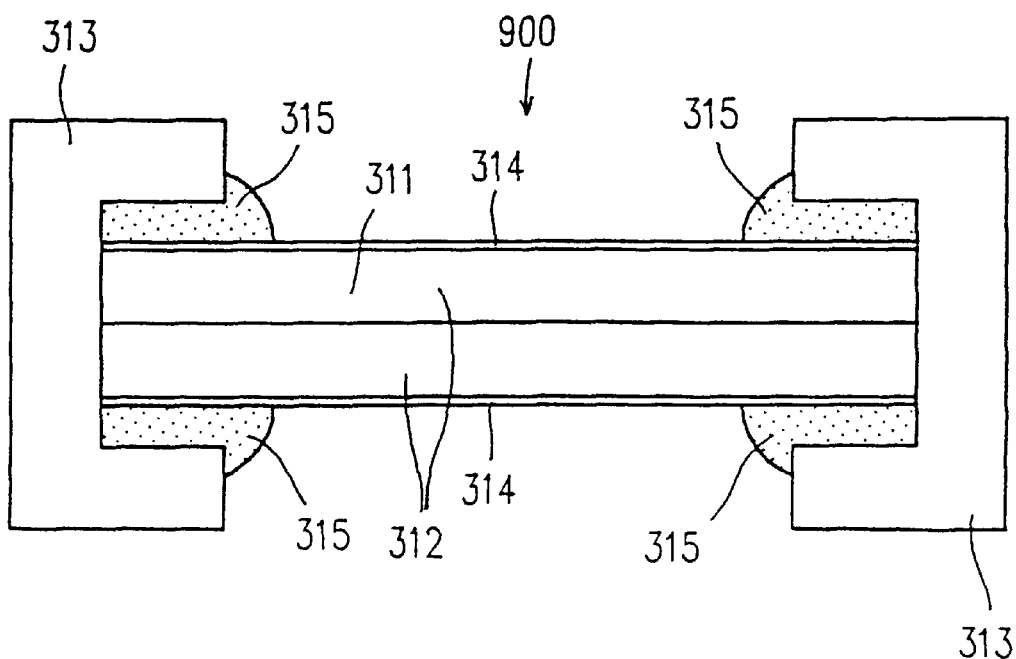
FIG. 37 is a cross-sectional view showing a structure for another conventional acceleration sensor.

The height (thickness) of the protrusions is suitably in the range of 20 to 150 $\mu$m, more preferably in the range of 50 to 100 $\mu$m. The shape of each protrusion is not limited to a linear shape, but may be a dot shape. As shown in FIG. 35A, a plurality of dot-shaped protrusions may be disposed linearly. Alternatively, as shown in FIG. 35B, a plurality of dot-shaped protrusions may be disposed at random within a region of a predetermined width D in the central portion in the longitudinal direction. In FIG. 35B, L and W denote the longitudinal length and width of the piezoelectric plate 302, respectively. The width D of this region is preferably in a range of 200 to 800 $\mu$m, more preferably in a range of 200 to 500 $\mu$m. That is, the ratio D/L is preferably in a range of 0.04 to 0.16, more preferably in a range of 0.04 to 0.1. If the ratio D/L is lower than 0.04, the shock-resistance may not be sufficient. If the ratio D/L is larger than 0.1, the sensitivity may not be sufficient.

In an acceleration sensor, unless the frequency region to be detected is sufficiently apart from the resonance frequency, the detection sensitivity disadvantageously depends on the frequency. In order to obtain an acceleration sensor exhibiting linear characteristics over a wide frequency region, it is necessary to use a piezoelectric vibrator with a high resonance frequency. In this example, the resonance frequency of the piezoelectric vibrator is 20 kHz, so that the acceleration in the frequency range of 50 to 10 kHz may be measured with high accuracy. The acceleration which can be measured is in the range of 0 to 1500 G, so that excellent linear characteristics are obtained with respect to the acceleration of 20 G or more.

Figure 26:
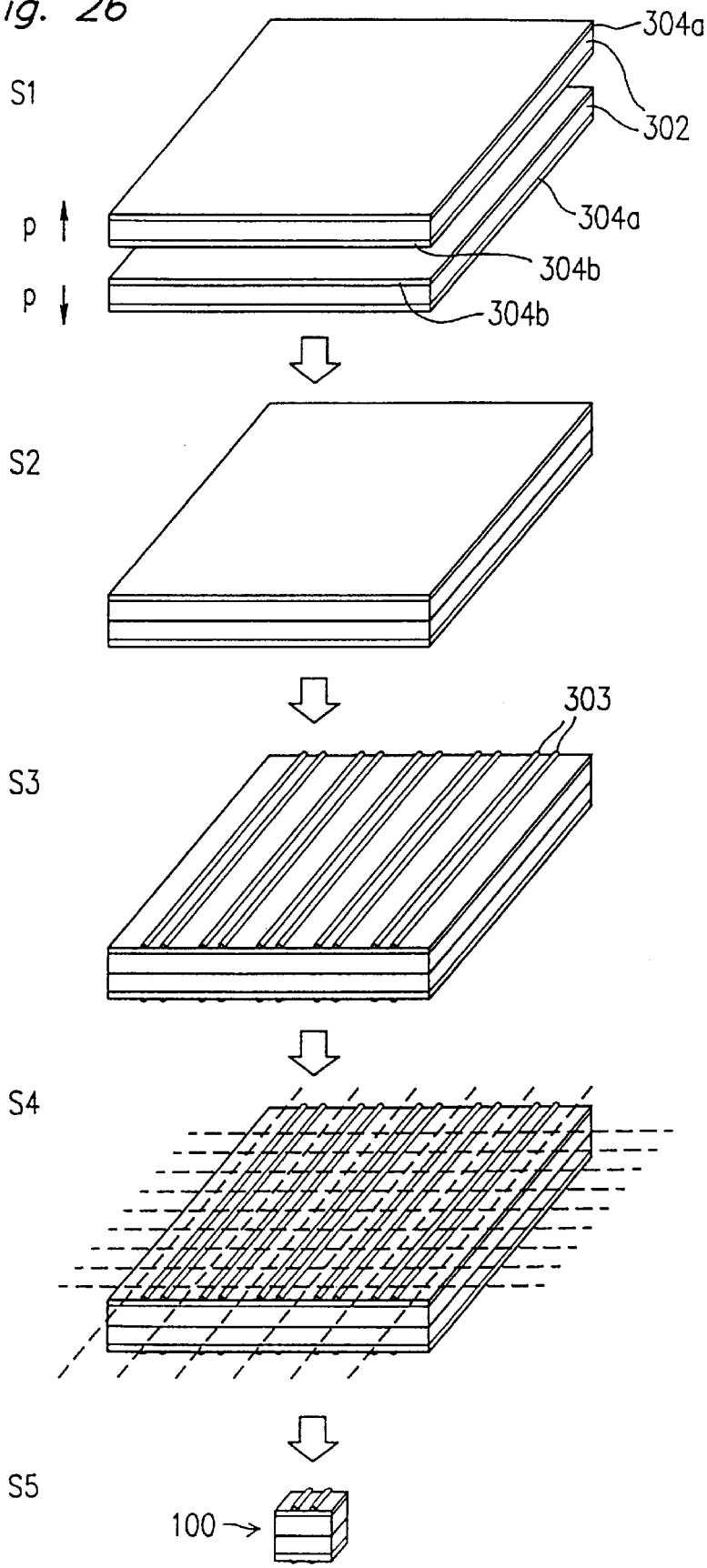
FIG. 26 is a series of perspective views showing the steps (S1–S5) for producing the piezoelectric vibrator by the method according to one example of the present invention.

The protrusions 303 are formed by a thermal spraying process. The thermal spraying process makes it possible to obtain a sufficient adhesive strength without heating the bimorph piezoelectric element at a high temperature and to form the protrusions having a satisfactory mechanical strength easily in a short period of time. Referring to FIG. 26, a method for producing a piezoelectric vibrator according to the present invention will be described below as being applied to the bimorph piezoelectric vibrator 100 shown in FIG. 25.

An electrode 304a and 304B are formed on each principal surface of the two piezoelectric ceramic plates 302. By applying a predetermined voltage across the electrode 304a and 304B, the two piezoelectric ceramic plates 302 are polarized (S1 in FIG. 26). Then, the two piezoelectric ceramic plates 302 are attached to each other so that the respective electrodes 304a face outward (as shown in S2 of FIG. 26). This attaching step may be performed by using an adhesive, such as a epoxy resin, having high adhesive strength and high elastic modules. The layer of the adhesive is thin enough not to obstruct the vibration of the piezoelectric element. The attached two electrodes 304b are electrically connected to each other. In figures showing structures of the piezoelectric element after the attaching step, the attached electrodes and the adhesive layer are not shown. The two polarization directions of the two piezoelectric ceramic plates 302 are not limited to the directions P in FIG. 1B. These directions may be opposed to each other. That is, the two piezoelectric ceramic plates 302 may be attached to each other so that the respective electrodes 304a face inward.

Next, a metallic mask (not shown) made of inver or the like is placed on one of the electrodes 304a formed on a piezoelectric ceramic plate 302. The metallic mask has an opening in a portion corresponding to the protrusions 303. The height of the protrusions 303 may be adjusted by controlling the time period for thermal spraying. In this example, the thickness of the metallic mask is set to be 0.2 mm. Subsequently, spray particles are sprayed through the opening of the metallic mask onto the electrode 304a by using a plasma spraying apparatus. As a result, the protrusions 303 are formed on the electrode 304a by the spray particles passing through the opening of the metallic mask (as shown in S3 of FIG. 26). In the same way, the sprayed protrusions 303 are formed on the other electrode 304a. In place of the metallic mask, a photoresist mask may be placed by a photolithography technique. As a material of photoresist mask, a liquid type resist or a dry-film resist may be used.

Finally, the piezoelectric ceramic plate on which the protrusions 303 are formed are cut so as be divided into a plurality of parts of a predetermined size (as shown in S4 of FIG. 26, thereby obtaining piezoelectric vibrators 100 (as shown in S5 of FIG. 26). The piezoelectric ceramic plate may be cut by using a dicing apparatus or a wire saw.

Figure 27:
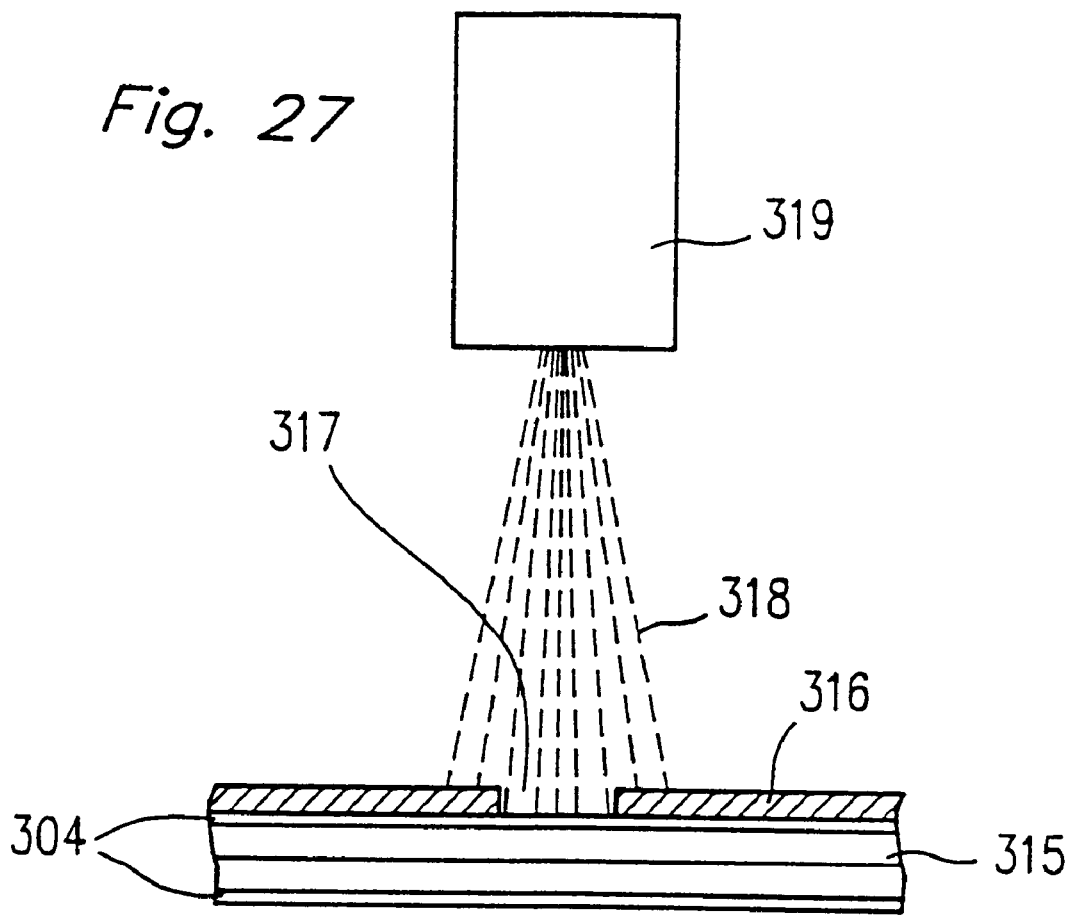
FIG. 27 is a schematic view showing a thermal spraying process according to an example of the present invention.

Hereinafter, referring to FIG. 27, the thermal spraying process of this example will be described. First, argon gas and helium gas to be used as carrier gases and metal particles are supplied to a plasma spraying apparatus. In this example, the flow rate of argon gas and helium gas is set to be 15 SLM and 3 SLM, respectively. As metal particles, molybdenum particles with an average particle size of 25 $\mu$m are used. An arc discharge (arc current: 400 A; voltage: 30 V) is generated inside the plasma spraying apparatus, thereby fusing the metal particles so as to eject the metal spray particles 318 from a plasma torch 319. The spray particles 318 ejected from the plasma torch 319 are sprayed through the opening 317 of the metallic mask 316 onto the piezoelectric ceramic plate 315. As a result, the protrusions are formed at the portions on the piezoelectric ceramic plate 315 which correspond to the opening 17 of the metallic mask 316. All through this process, the piezoelectric ceramic plate 315 stands at an ambient temperature.

According to this thermal spraying process, the minute particles of the metal material and the ceramic material are fused at a high temperature by passing the particles through the plasma at a high temperature, and then the minute particles fused at a high temperature are sprayed onto a substrate with a gas current, thereby forming a coating composed of the minute particles on the substrate.

The formation of the protrusions 303 by the use of the thermal spraying process has the following advantages.

(1) Even a thick film may be formed easily in a short period of time.

(2) The coating to be obtained by the thermal spraying process (hereinafter, simply referred to as a sprayed film) is formed by continuously depositing the minute particles at a high temperature, so that a coating having strong adhesion among the respective particles is obtained.

(3) Although the respective minute particles are fused at a high temperature, the heat capacity of each minute particle is very small, and the minute particles are sprayed onto the substrate with a gas current, so that the increase of the substrate temperature is considerably smaller as compared with the brazing process, the soldering process, and the like.

The point of the method of this example lies in that the protrusions are formed by the thermal spraying process.

According to the thermal spraying process for forming the protrusions, it is possible to easily form protrusions having a sufficient adhesive strength and a satisfactory mechanical strength on a bimorph piezoelectric element in a short period of time without heating the bimorph piezoelectric element at a high temperature. In addition, a thick film with a thickness of 100 μm or more may be formed easily.

Figure 38:
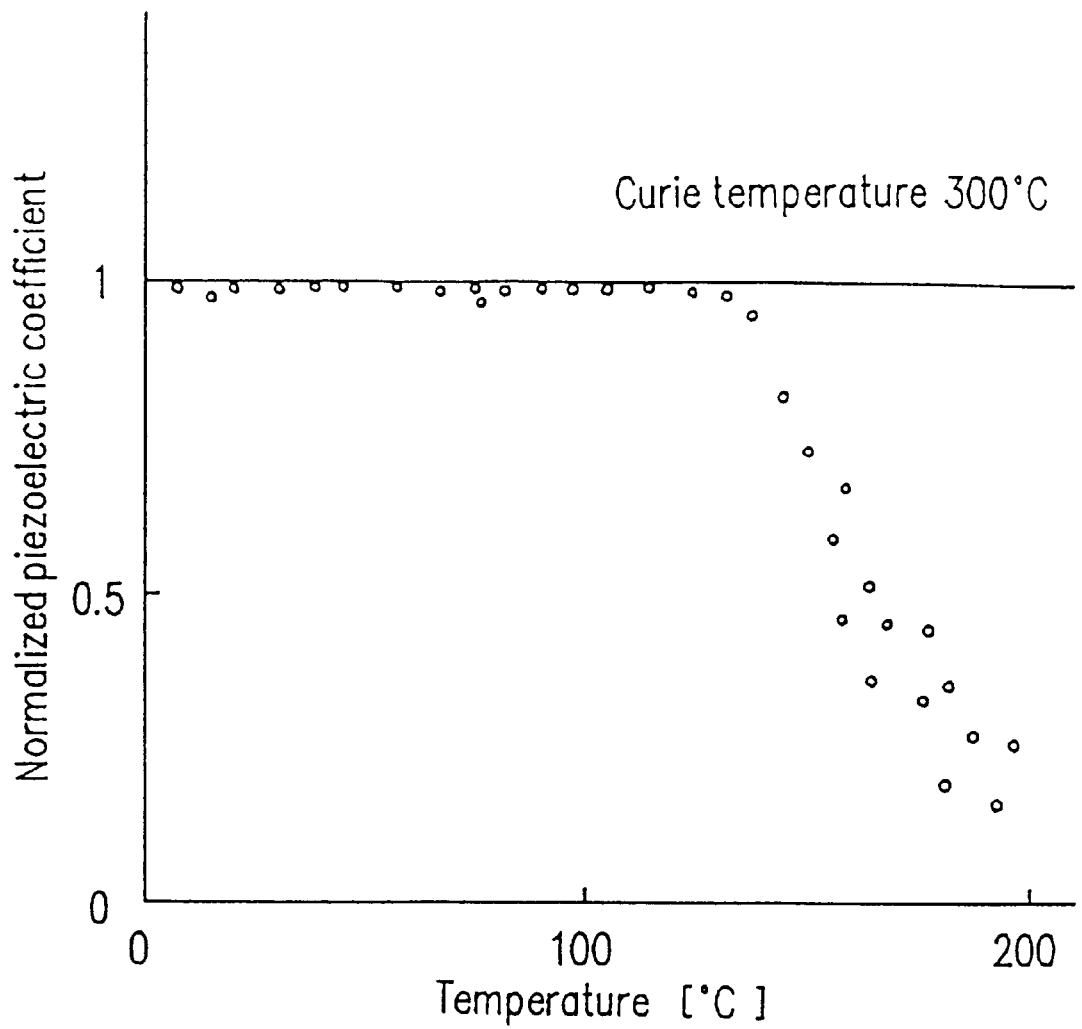
FIG. 38 is a graph showing the relationship between a piezoelectric coefficient and the heating temperature.

In fact, according to the thermal spraying process, the substrate temperature increases to a temperature sufficiently lower than the temperature (about 130° C. as shown in FIG. 38, where the characteristics of the bimorph piezoelectric element begins to deteriorate. As a result, the increase in the temperature of the bimorph piezoelectric element during the formation of the protrusions is sufficiently lower as compared with a conventional brazing process, or the like, so that the characteristics of the bimorph piezoelectric element are hardly affected by the increase in the temperature of the element itself.

Moreover, since a thick film with a thickness of 100 μm or more may be formed, even when the bimorph piezoelectric element is distorted upon the application of a strong acceleration to the bimorph piezoelectric element, the bimorph piezoelectric element is not likely to come into contact with a holding member or a package, so that the acceleration over a wide range may be detected constantly. Accordingly, the natural features of a bimorph piezoelectric element may be more fully realized.

Figure 28:
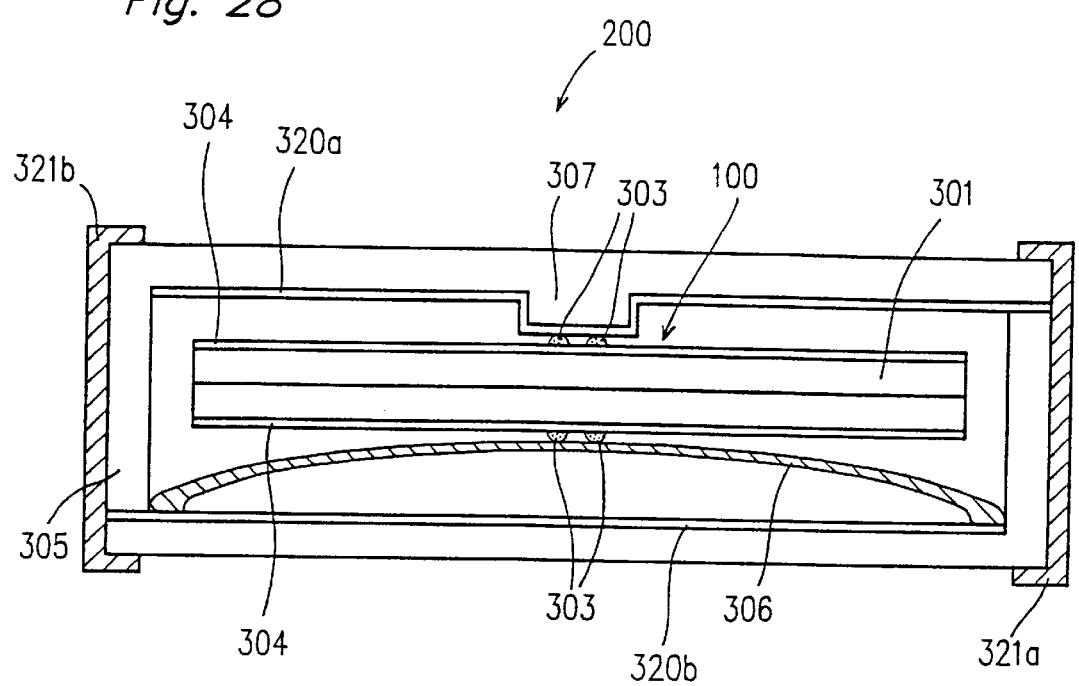
FIG. 28 is a cross-sectional view of an acceleration sensor according to an example of the present invention.

FIG. 28 shows a cross-sectional view of an acceleration sensor 200 using the bimorph piezoelectric element 301 shown in FIG. 25, FIG. 28 is a cross-sectional view of the acceleration sensor 200 in the longitudinal direction. In this example, the size of the element is set as follows: the length: 6 mm; the height: 1.8 mm; and the width: 2.8 mm. The bimorph piezoelectric element 301 is held inside a package (holding body) 305 by sandwiching the bimorph piezoelectric element 301 between an elastic holding member 306 and the convex portion 307 formed on an upper internal surface of the package 305 at the protrusions 303 formed on the bimorph piezoelectric element 301. The elastic holding member 306 is provided for holding the bimorph piezoelectric element 301 by giving a constant pressure thereto and not for obstructing the vibration of the bimorph piezoelectric element 301. The bimorph piezoelectric element 301 is supported at its central portion. The pressure to be given to the bimorph piezoelectric element 301 is determined in consideration of the impact to be externally applied, the strength of the bimorph piezoelectric element 301, the sensitivity of the element 301 to the acceleration, and the like.

When an acceleration having upward components and downward components are given to the acceleration sensor 200 shown in FIG. 28, loads are generated in the central portion of the bimorph piezoelectric element 301 held by the holding member 306, so that a distortion is generated in the bimorph piezoelectric element 301. The piezoelectric effect of the bimorph piezoelectric element 301 causes the generation of the charges inside the distorted bimorph piezoelectric element 301. The charges thus generated may be output through the electrodes 304. The amount of the charges to be generated is in proportion to the degree of the distortion, i.e. the degree of the acceleration externally applied, so that the degree of the acceleration may be detected as the amount of electrical charges.

Figure 29:
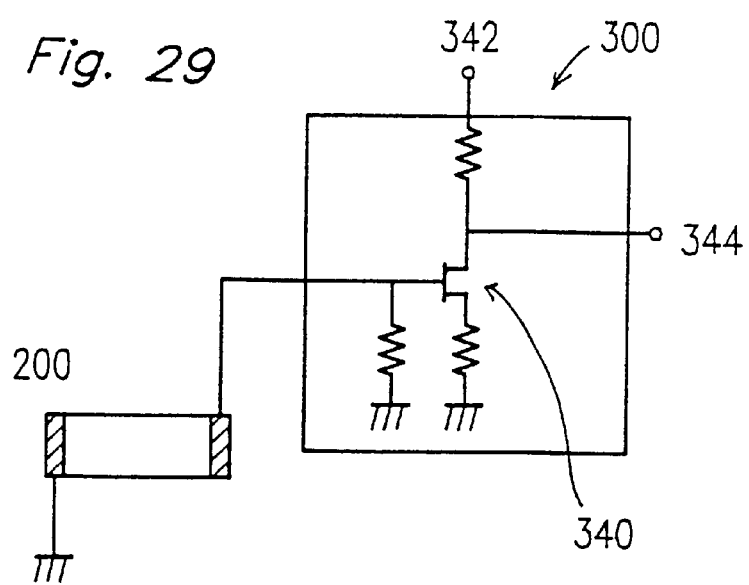
FIG. 29 is a circuit diagram for an acceleration sensor according to an example of the present invention.

The charges output through the external electrodes 321a and 321b are amplified by the circuit 300 shown in FIG. 29, so that the output signals from the circuit 300 may be used as the signals showing the acceleration. The circuit 300 of this example is a current-voltage converting amplifier using a field-effect transistor (FET) 340. The gate of the FET 340 is connected to the external electrode of the acceleration sensor 200. The source of the FET 340 is connected to a power supply 342 through a resister and also to a output terminal 344. According to the present invention, an optimal circuit for the usage of an acceleration sensor, other than this type of circuit, may also be used.

In the structure shown in FIG. 28, the central portions of the bimorph piezoelectric element 301 may be held stably and strongly within a narrow holding width. As a result, the resonance frequency of this bimorph piezoelectric element 301 becomes higher than that of a cantilever type bimorph piezoelectric element of the same length in which only one end thereof is held. Accordingly, even acceleration with a higher frequency component may be measured. The distortion is likely to be generated from the portion very near the hold point, therefore, high sensitivity to the acceleration may be obtained.

In addition, since the protrusions 303 may be formed at the predetermined positions with very high precision by the use of a metallic mask, etc., the variation of the hold points may be reduced. The variation of the hold points may be reduced as compared with a holding method using an adhesive or the like , where the variations of the holding width, the hold points, and the holding strength varies depending upon the amount of the adhesives and the temperature.

Moreover, the protrusions 303 are formed by using a conductive material on the electrodes 304 of the bimorph piezoelectric element 301, so that the protrusions 303 may be used for outputting the charges generated in the bimorph piezoelectric element 301 upon the application of an acceleration. A conductive thin film 320a made of silver palladium or the like is formed on the convex portion 307 of the package 305 by a printing process or a plating process, and the thin film 320a is electrically connected to the external electrode 321a provided on an outer surface of the package 305. The elastic holding member 306 is made of conductive metal such as a stainless alloy, and functions as a lead line for outputting the charges from one surface of the bimorph piezoelectric element by coming into contact with the protrusions 303 formed on the electrode 304 of the bimorph piezoelectric element 301 upon the application of a pressure. A electrically conductive thin film 320b electrically connected to an external electrode 321b is formed on an internal surface of the package 305 so as to be in contact with the elastic holding member 306, thereby electrically connecting the electrode 304 on the other surface of the bimorph piezoelectric element 301 to the external electrode 21b. In this way, the charges generated in the bimorph piezoelectric element 301 upon the application of an acceleration may be output easily without using a conductive adhesive or the like, and the variation of the characteristics caused by the dispersion of the application range of a conductive adhesive may be prevented.

As a piezoelectric element for detecting the acceleration, not only a bimorph piezoelectric element but also a multi-layered piezoelectric element obtained by attaching multiple piezoelectric plates to each other, a single-layered piezoelectric element, and a unimorph piezoelectric element obtained by attaching a piezoelectric plate to a shim material may be used. As a bimorph piezoelectric element, an element obtained by sandwiching a shim material may be used. In addition, a piezoelectric element including a piezoelectric film deposited on a substrate and an electrode may be used. A piezoelectric material is not limited to piezoelectric ceramic but lithium niobate or the like may also be used. In place of molybdenum, metal materials such as nickel-chrome alloy, stainless alloy, tungsten, brass, silver, copper alloy, and aluminum alloy; or an electrically conductive ceramic material may be used as a material for forming the protrusions 303. The number of the linear protrusions 303 to be formed on each surface is not limited to two, but may be one, three, or more if it is necessary for stabilizing the hold point on the protrusions or for adapting the protrusions to the area to be held. The same effects may be attained in the case of using different numbers of protrusions for the respective surfaces of a bimorph vibrator to be held. Furthermore, the shape of the protrusions 303 is not necessarily required to be linear.

As is apparent from the foregoing description, a highly reliable small-sized acceleration sensor, which exhibits high sensitivity to any acceleration applied and shows a small variation of the characteristics, may be obtained by using a spraying process in which protrusions, showing a mechanical strength strong enough not to be plastically deformed largely even under a pressure given from above and from below; and a sufficient adhesive strength without heating a bimorph piezoelectric element at a high temperature, are formed in the central portions of the bimorph piezoelectric element, and held stably.

EXAMPLE 9

Figure 30:
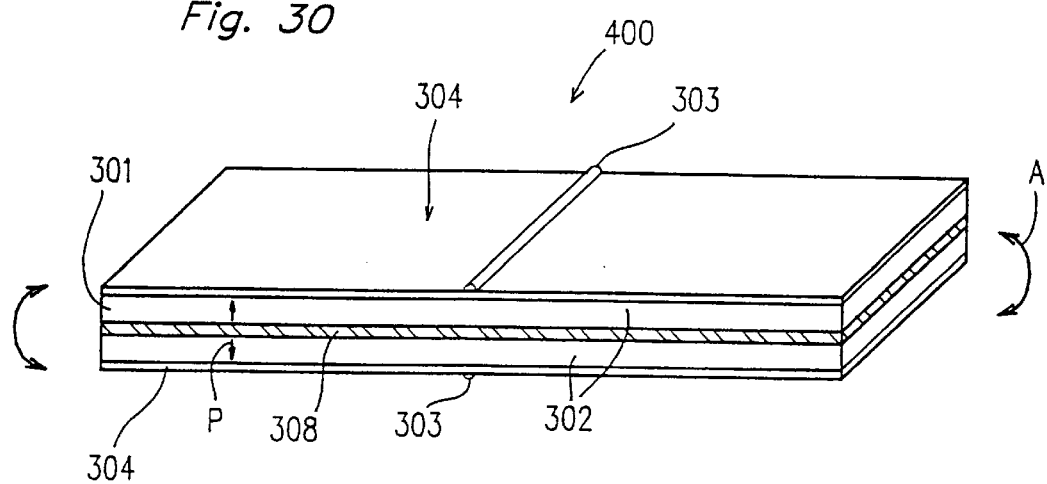
FIG. 30 is a perspective view of a piezoelectric vibrator for constituting an acceleration sensor according to another example of the present invention.

FIG. 30 is a perspective view of a piezoelectric vibrator 400 for constituting an acceleration sensor according to a ninth example of the present invention. A bimorph piezoelectric element 301 formed by sandwiching and bonding a shim between a pair of piezoelectric ceramic plates 302 is used as a piezoelectric vibrator. As a shim 308, a phosphorus-bronze plate, a stainless plate, or the like may be used. The shim 308 increases the mechanical strength of a piezoelectric vibrator, and facilitates the mounting of the vibrator into a package. Electrodes 304 are formed on both opposed principal surfaces of the piezoelectric vibrator. In the central portion of each principal surface of the bimorph piezoelectric element 301, a linear metallic protrusion 303 made of a relatively harder metal material such as a nickel-chrome alloy, nickel-chrome-aluminum alloy or molybdenum or a conductive ceramic material is formed by a thermal spraying process or the like so as to have a fine ruggedness of several μm to several hundreds of μm. In this case, the width and the thickness of the protrusion 303 are determined so that the protrusions 303 hold the bimorph piezoelectric element 301 stably in view of the vibration-resistance and the impact-resistance thereof, and the effect to be given to the characteristics of the piezoelectric vibrator. The material for the protrusions 303 is required to be mechanically stable under the holding force, and to exhibit constant electrical properties for functioning as the lead lines. Therefore, the material for the protrusions 303 is selected in consideration of rust-resistance, the electric conductivity, the elastic modules (or the hardness) thereof, and the like.

Figure 31:
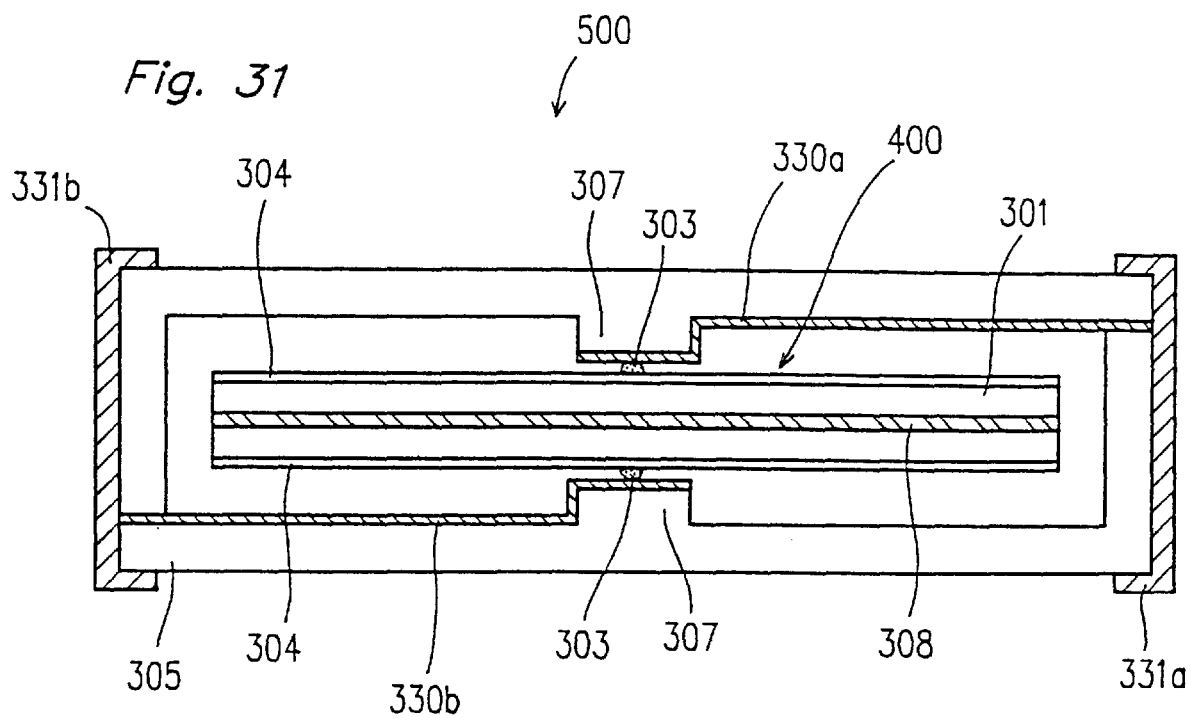
FIG. 31 is a cross-sectional view of an acceleration sensor according to another example of the present invention.

FIG. 31 is a cross-sectional view of a holding structure for the piezoelectric vibrator 400 shown in FIG. 30, for constituting an acceleration sensor 500 of the present invention along the longitudinal direction of the piezoelectric vibrator 400. The convex portions 307 formed on the two opposed internal surfaces of the package 305 are made of a PPS resin or the like. The gap between the two convex portions 307 is determined so that the bimorph piezoelectric element 301 is held stably in consideration of the mechanical properties such as hardness, Young's modules and the like of the package 305 and the protrusions 303. The piezoelectric vibrator 400 is held by being press-fitted between the two convex portions 307 formed inside the package 305. In the case where the convex portions 307 of the package 305 are made of a material with a lower hardness than that for the protrusions, the fine ruggedness in the contact areas of the top ends of the protrusions engage into the convex portions 307 of the package 305, so that the bimorph piezoelectric vibrator 400 is held stably. Even if the contact areas between the piezoelectric vibrator 400 and the convex portions 307 of the package 305 functioning as holding members is reduced by reducing the area of the top ends of the protrusions 303, such a mechanical engagement makes it possible to hold the piezoelectric vibrator 400 stably so as to exhibit excellent vibration-resistance and impact-resistance.

An electrode pattern electrically connected to the external electrode is formed on each upper surface of the two convex portions 307 of the package 305 by a plating process or the like. If the conductive protrusions come into contact with the electrode patterns 330, then the electrodes 304 formed over both principal surfaces of the bimorph piezoelectric element 301 become electrically conductive with the external electrodes 331a and 331b, and therefore the output signals to be generated upon the application of an acceleration may be output easily.

In the eighth example described above, electrically conductive protrusions to be formed on the piezoelectric vibrator are made of a relatively harder metal material such as a nickel-chrome alloy, a nickel-chrome-aluminum alloy and molybdenum. In the same way, a metal material such as a stainless alloy, tungsten, brass, copper alloy and an aluminum alloy may be used. In addition, the same effects may be maintained by using a ceramic material so long as the material has an electrical conductivity. A ceramic material or the like is used for the convex portions of the package, instead of a PPS resin used in this example. Alternatively, only the convex portions may be made of a resin, while the remaining portions of the package may be made of a ceramic material or the like.

As described above, according to the present invention, the piezoelectric vibrator is held by being press-fitted between the conductive protrusions formed on the piezoelectric vibrator and the convex portions inside the package; and the fine ruggedness on the top portions of the conductive protrusions formed on the piezoelectric vibrator engage into the contact areas between the protrusions and the holding members for the piezoelectric vibrator because of the difference in the hardness between the holding members and the protrusions, so that a mechanical engagement is established between the holding members and the protrusions and the piezoelectric vibrator may be held stably. In addition, even if the contact area between the piezoelectric vibrator and the holding members is enlarged, an effective contact area may be kept small because of the fine ruggedness on the top ends of the protrusions. Accordingly, the piezoelectric vibrator is stably held so as to exhibit excellent characteristics; and a highly reliable small-sized acceleration sensor having high sensitivity to the acceleration and a small variation of the characteristics may be provided.

EXAMPLE 10

Figure 32:
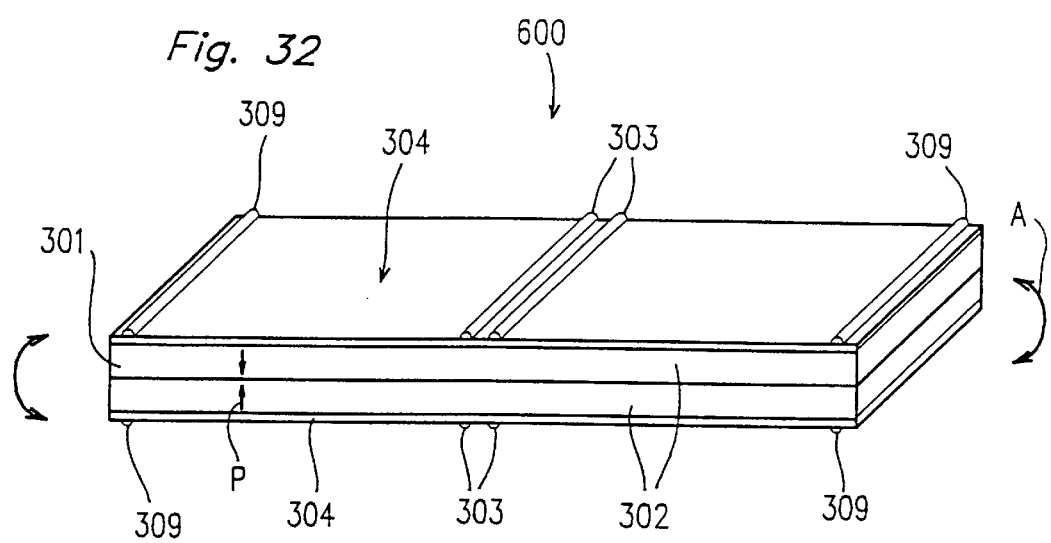
FIG. 32 is a perspective view of a piezoelectric vibrator for constituting an acceleration sensor according to still another example of the present invention.

FIG. 32 is a perspective view showing a piezoelectric vibrator 600 for constituting an acceleration sensor according to a tenth example of the present invention. As shown in FIG. 32, a bimorph piezoelectric element 301 is formed by attaching two piezoelectric ceramic plates 302 to each other; and an electrode 304 is formed on each principal surface of the piezoelectric ceramic plates 302. In the central portions of the two opposed principal surfaces of the bimorph piezoelectric element 301, the protrusions made of molybdenum are formed linearly on the respective electrodes 304 by a thermal spraying process. Moreover, additional-mass portions 309, which function as an additional-mass made of a metal material are linearly formed in both end portions of the two principal surfaces of the bimorph piezoelectric element 301. In this example, the additional-mass portions 309 and the protrusions 303 for holding the central portions are formed at the same time using molybdenum for both portions by a thermal spraying process.

In this case, the width and the thickness of the protrusions 303, and the gap between the two protrusions 303 formed on each surface are determined so that the protrusions 303 hold the bimorph piezoelectric element 301 stably in view of the vibration-resistance and the impact-resistance thereof, and the effect to be given to the characteristics of the piezoelectric vibrator 301. The material for the protrusions 303 are required to be mechanically stable even under the holding force, and to exhibit constant electrical properties for functioning as the lead lines. Therefore, the material for the protrusions 303 is selected in consideration of the conductivity, the elastic modules (or the hardness), the rust-resistance thereof, and the like. A process for forming the protrusions 303 is selected so that the protrusions having a sufficient mechanical strength and showing a sufficient adhesive strength without heating the piezoelectric vibrator to a high temperature are easily obtained at a higher rate than conventional. Accordingly, the deterioration of the characteristics of the piezoelectric vibrator is almost negligible, and therefore the natural properties of the piezoelectric vibrator may be utilized.

The additional-mass portions 309 formed on both end portions of the two principal surfaces of the bimorph piezoelectric element 301 improves the sensitivity of the element 301 to any acceleration. The additional mass 309 is determined in view of the necessary sensitivity, and a desirable mass may be obtained by changing the film thickness. The additional mass portions 309 may be formed at the same time as the formation of the central protrusions 303 by using a mask. Therefore, the additional mass portions 309 may be formed without increasing the number of production steps. In forming the additional mass portions 309, if a material of a high density for satisfying the necessary conditions for the material of the protrusions is used for the additional mass portions 309, even greater effects may be attained.

Figure 33:
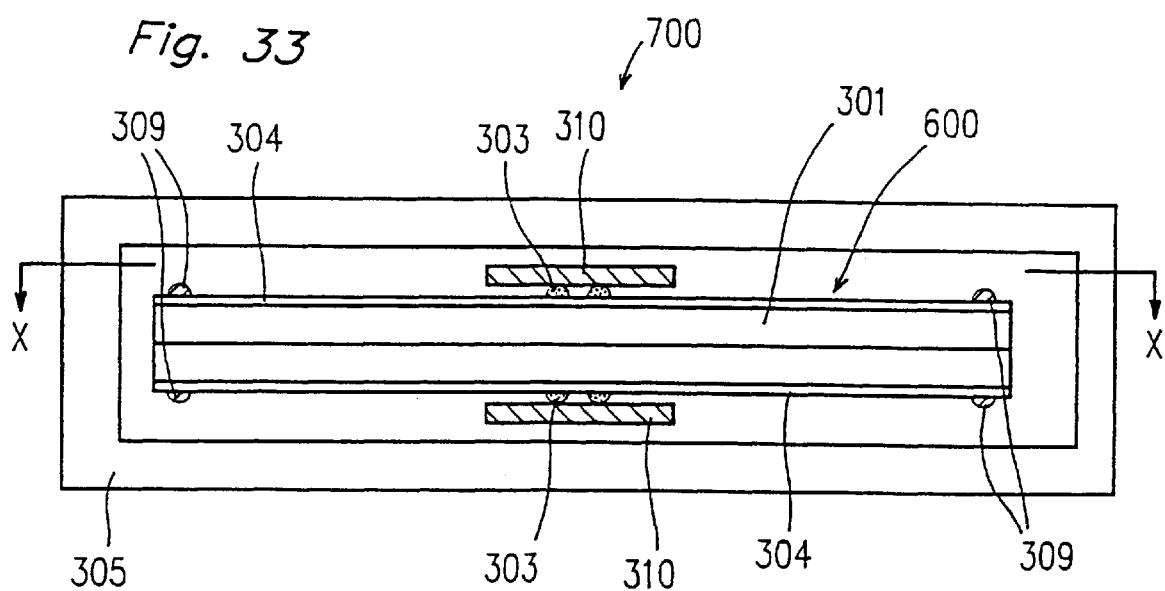
FIG. 33 is a cross-sectional view of an acceleration sensor according to still another example of the present invention.

FIG. 33 is a cross-sectional view of a holding structure of the bimorph piezoelectric vibrator 600 shown in FIG. 32 for constituting an acceleration sensor 700 of the present invention along the longitudinal direction of the piezoelectric vibrator 600. FIG. 34 is a cross-sectional view of the acceleration sensor 700 taking along the X—X direction in FIG. 33. The bimorph piezoelectric element 301 is held by sandwiching the element 301 between a pair of elastic holding members 310 at the protrusions 303 formed in the central portions of the bimorph piezoelectric element 301, and then the holding members 310 are held inside the package 305. The elastic holding members 310 may hold the piezoelectric vibrator 600 by giving a constant pressure thereto, and may hold the central protrusions of the piezoelectric vibrator 600 strongly and stably within a narrow holding width without obstructing the vibration of the piezoelectric vibrator 600, so that the distortion caused by the vibration is likely to be generated very near the hold points and high sensitivity to any acceleration may be obtained.

In addition, since the protrusions 303 may be formed at the predetermined positions with very high precision by the use of a metallic mask, etc., the variation of the hold points may be reduced. The variation may be reduced as compared with a holding method using an adhesive or the like, where the variations of the holding width, the hold points, and the holding strength varies depending on the amount of the adhesive and the temperature.

The protrusions 303 are formed on the electrodes 304 of the piezoelectric vibrator 600 by using a conductive material, and play the part of outputting the charges generated in the piezoelectric vibrator 600 upon the application of an acceleration. The elastic holding members 310 have an electrical conductivity so as to function also as the lead lines, and are disposed so that the electrodes 304 provided over both principal surfaces of the piezoelectric vibrator 600 are not short-circuited. Conductive patterns maintaining a conductivity with the external electrodes are formed at the positions inside the package where the elastic holding members 310 are held. Therefore, by holding the elastic holding members 310 at such positions, the electrodes formed on both principal surfaces of the piezoelectric vibrator 600 are electrically connected to the external electrodes.

In holding the elastic holding members 310 inside the package, the members 310 may be press-fitted to the package or may be bonded with a conductive adhesive or the like. Even a small-sized piezoelectric element may be treated easily if the piezoelectric vibrator is sandwiched between the elastic holding members and then held inside the package.

As a piezoelectric element for detecting the acceleration, not only a bimorph piezoelectric element but also a multi-layered piezoelectric element obtained by attaching multiple piezoelectric plates to each other, a single-layered piezoelectric element, and a unimorph piezoelectric element obtained by attaching a piezoelectric plate to a shim material may be used. As a bimorph piezoelectric element, an element obtained by sandwiching a shim material may be used. In addition, a piezoelectric element including a piezoelectric film deposited on a substrate and an electrode may be used. The shape of the piezoelectric vibrator is not limited to a rectangular shape, but may be a disc shape. A piezoelectric material is not limited to piezoelectric ceramic but lithium niobate or the like may also be used. In place of molybdenum, metal materials such as nickel-chrome alloy, stainless alloy, tungsten, brass, silver, copper alloy and aluminum alloy; or an electrically conductive ceramic material may be used as a material for forming the protrusions 303. The number of the linear holding protrusions 303 is not limited to one for each principal surface, and the number of the linear additional mass portions 309 is not limited to one for each end portion, but two or more protrusions and additional-mass portions may be formed, or they may be formed on only one principal surface of the piezoelectric vibrator. The shape of the holding protrusions 303 and the additional mass portions 309 is not limited to a linear shape, but a plurality of dot-shaped protrusions may be formed instead. The thickness of the additional mass portions 309 is not necessarily required to be the same as the thickness of the holding protrusions 303. In order to increase the additional mass, after the holding protrusions 303 are formed so as to have a predetermined thickness, metal particles or the like may be further sprayed only to the additional mass portions by covering the holding protrusions 303 with a mask, etc. The same kind of material is not necessarily used for the additional mass portions and for the holding protrusions, but different kinds of materials may be used, respectively.

As is apparent from the foregoing description, a highly reliable small-sized acceleration sensor, which exhibits high sensitivity to the acceleration to be applied and shows a small variation of characteristics, may be obtained by using a thermal spraying process in which protrusions, showing a mechanical strength strong enough not to be plastically deformed largely even under a pressure given from above and below; and a sufficient adhesive strength without heating a piezoelectric vibrator at a high temperature, are formed in the central portions of the piezoelectric vibrator and held stably by the holding members, and then the holding members are held inside the package.

A piezoelectric vibrator of an acceleration sensor of this invention includes conductive protrusions made of a metal material or a ceramic material formed by a thermal spraying process, and the piezoelectric vibrator. Since the conductive protrusions formed by the thermal spraying process are excellent in mechanical strength and adhesive strength, the piezoelectric vibrator may be held stably. As a result, an acceleration sensor having excellent Impact-resistance may be provided. By holding the piezoelectric vibrator at the central portions thereof, the end portions of the vibrator are allowed to vibrate freely in the same way as a piezoelectric vibrator under a cantilever type structure. Therefore, the vibrator exhibits high sensitivity and may detect an acceleration (a vibration) even in a high frequency region. Since the area necessary for holding the piezoelectric vibrator is small, an acceleration sensor of a small size may be provided. Moreover, since the electrodes formed on the respective principal surfaces of the piezoelectric vibrator are connected to outside of the package through the conductive protrusions formed on the respective electrodes, the structure of the acceleration sensor may be simplified and small.

According to the production method of an acceleration sensor of the invention, the conductive protrusions are formed by the thermal spraying process, so that the piezoelectric element is never heated at a high temperature during a processing. Therefore, a method in which thermal deterioration of the piezoelectric characteristics is prevented may be provided. Furthermore, the conductive protrusions may be processed with high precision by the thermal spraying process, thereby providing a method excellent in the reproducibility of the piezoelectric characteristics, the stable mass-productivity.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. An acceleration sensor comprising:

a piezoelectric vibrator including a piezoelectric element having a first principal surface and a second principal surface opposed each other, a first and second electrode formed on the first and second principal surface, and conductive protrusions wherein the conductive protrusions comprise thermally sprayed melted particles and the thermally sprayed melted particles comprise a heated starting material having a particle size in a range of 5 $\mu$m to 300 $\mu$m where the starting material is a metal material or a ceramic material, and wherein the conductive protrusions form a thick film having a minute roughness surface, wherein the minute roughness is in a range of 2 $\mu$m to 10 $\mu$m; and a holding body for the piezoelectric vibrator via the conductive protrusions.

2. An acceleration sensor according to claim 1, wherein the conductive protrusions are formed in longitudinal central portions of the piezoelectric vibrator.

3. An acceleration sensor according to claim 1, wherein the holding body includes a holding member having an elastic property, and the piezoelectric vibrator is held by the holding member via at least one of the conductive protrusions formed on the first and second electrode of the piezoelectric vibrator.

4. An acceleration sensor according to claim 1, wherein the piezoelectric vibrator is press-fitted into the holding body and the piezoelectric vibrator is held via the conductive protrusions by the holding body.

5. An acceleration sensor according to claim 1, wherein the holding body includes a holding member made of a material having a lower hardness than that of the conductive protrusions and at least one of the protrusions is press-fitted into the holding member.

6. An acceleration sensor according to claim 1, wherein the piezoelectric element is selected from a group including: a bimorph piezoelectric element; a multilayered piezoelectric element obtained by attaching multiple piezoelectric plates; a single layered piezoelectric element; a unimorph piezoelectric element obtained by attaching a piezoelectric plate to a shim; a bimorph piezoelectric element interposing a shim therebetween; and a piezoelectric element including a piezoelectric film deposited on a substrate and an electrode.

7. An acceleration sensor according to claim 1, wherein the piezoelectric vibrator further comprises protrusions made of a metal material or a ceramic material and formed by a thermal spraying process in longitudinal end portions of the piezoelectric vibrator on at least one of the first and second electrodes.

8. An acceleration sensor according to claim 1, wherein the conductive protrusions are arranged in a symmetric manner on the first and the second electrodes.

9. An acceleration sensor according to claim 1, wherein the conductive protrusions are linear protrusions extending in a width direction of the piezoelectric vibrator.

10. An acceleration sensor according to claim 1, wherein a length in a longitudinal direction of the piezoelectric element is longer than 3.5 times of that in width direction.

11. An acceleration sensor according to claim 1, wherein a height of the conductive protrusions is in a range of 50 $\mu$m to 150 $\mu$m.

12. An acceleration sensor formed by the following processing steps:

providing a piezoelectric vibrator including a piezoelectric element having a first principal surface and a second principal surface opposed to each other;

forming a first and a second electrode formed on the first and the second principal surface; and depositing melted particles on the piezoelectric element via a thermal spraying process to form a thick film of large conductive protrusions, wherein the conductive protrusions comprise thermally sprayed melted particles and the thermally sprayed melted particles comprise a heated starting material having a particle size in a range of 5 μm to 300 μm, where the starting material is a metal material or a ceramic material, and wherein the thick film has a minute roughness surface where the minute roughness is in a range of 2 μm to 10 μm.

13. The acceleration sensor of claim 12 wherein the piezoelectric element reaches a temperature lower than about 130° C. during the depositing step.

14. The acceleration sensor of claim 12 wherein the conductive protrusions have a height in a range of 50 μm to 150 μm.

15. An acceleration sensor comprising a piezoelectric vibrator and a package enclosing the piezoelectric vibrator, the piezoelectric vibrator including:
   a piezoelectric element having two piezoelectric plates attached to each other, defining a plane and having a first face and a second face,
   a first electrode formed on the first face and a second electrode formed on the second face, and
   conductive protrusions, wherein the conductive protrusions comprise thermally sprayed melted particles and the thermally sprayed melted particles comprise a heated starting material having a particle size in a range of 5 μm to 300 μm, where the starting material is a metal material or a ceramic material, and wherein the conductive protrusions form a thick film having a minute roughness surface, wherein the minute roughness is in a range of 2 μm to 10 μm; and
the package having a holder protruding from an internal surface of the package, the holder holding the piezoelectric vibrator at the central portion thereof,
wherein a distortion in the piezoelectric element is generated by a movement of end portions of the piezoelectric vibrator in a direction perpendicular to the plane in response to a load applied to the piezoelectric vibrator, the distortion generates detectable charges inside the piezoelectric element, and
wherein the holder cooperates to prevent the end portions of the piezoelectric vibrator from contacting the internal surface of the package when the end portions of the piezoelectric vibrator move in the direction perpendicular to the plane.

16. An acceleration sensor comprising a piezoelectric vibrator and a package enclosing the piezoelectric vibrator, the piezoelectric vibrator including:
   a piezoelectric element having a piezoelectric plate and a metal plate attached to each other, defining a plane and having a first face and a second face,
   a first electrode formed on the first face and a second electrode formed on the second face, and
   conductive protrusions, wherein the conductive protrusions comprise thermally sprayed melted particles and the thermally sprayed melted particles comprise a heated starting material having a particle size in a range of 5 μm to 300 μm, where the starting material is a metal material or a ceramic material, and wherein the conductive protrusions form a thick film having a minute roughness surface, wherein the minute roughness is in a range of 2 μm to 10 μm; and
the package having a holder protruding from an internal surface of the package, the holder holding the piezoelectric vibrator at the central portion thereof,
wherein a distortion in the piezoelectric element is generated by a movement of end portions of the piezoelectric vibrator in a direction perpendicular to the plane in response to a load applied to the piezoelectric vibrator, the distortion generates detectable charges inside the piezoelectric element, and
wherein the holder cooperates to prevent the end portions of the piezoelectric vibrator from contacting the internal surface of the package when the end portions of the piezoelectric vibrator move in the direction perpendicular to the plane.

17. An acceleration sensor according to claim 15, wherein the piezoelectric vibrator is held by the holder via the conductive protrusions.

18. An acceleration sensor according to claim 16, wherein the piezoelectric vibrator is held by the holder via the conductive protrusions.

19. An acceleration sensor according to claim 17, wherein the conductive protrusions are made of a metal material or a ceramic material.

20. An acceleration sensor according to claim 18, wherein the conductive protrusions are made of a metal material or a ceramic material.

21. An acceleration sensor comprising:
   a piezoelectric vibrator and a package enclosing the piezoelectric vibrator, the piezoelectric vibrator including:
      a piezoelectric element having two piezoelectric plates attached to each other, defining a plane and having a first face and a second face,
      a first electrode formed on the first face and a second electrode formed on the second face, and
      conductive protrusions, wherein the conductive protrusions comprise thermally sprayed melted particles and the thermally sprayed melted particles comprise a heated starting material having a particle size in a range of 5 μm to 300 μm, where the starting material is a metal material or a ceramic material, and wherein the conductive protrusions form a thick film having a minute roughness surface, wherein the minute roughness is in a range of 2 μm to 10 μm; and
   the package having a holder protruding from an internal surface of the package, the holder holding the piezoelectric vibrator at the central portion thereof,
   wherein a distortion in the piezoelectric element is generated by a movement of end portions of the piezoelectric vibrator in a direction perpendicular to the plane in response to a load applied to the piezoelectric vibrator, the distortion generates detectable charges inside the piezoelectric element,
   wherein the holder cooperates to prevent the end portions of the piezoelectric vibrator from contacting the internal surface of the package when the end portions of the piezoelectric vibrator move in the direction perpendicular to the plane, and
   wherein a polarization direction of one of the two piezoelectric plates is contrary to a polarization direction of the other piezoelectric plate of the two piezoelectric plates when the load is provided.

22. An acceleration sensor comprising:
   a piezoelectric vibrator including a piezoelectric element having two plates attached to each other, wherein the piezoelectric element includes:
      a first principal surface and a second principal surface opposed to each other, and
      a first electrode formed on the first principal surface and a second electrode formed on the second principal surface; and conductive protrusions, wherein the conductive protrusions are formed directly on the piezoelectric vibrator at longitudinal central portions thereof; and a holder for holding the piezoelectric vibrator via the conductive protrusions, wherein the acceleration sensor transduces a distortion in the piezoelectric element generated by a load in the central portions of the piezoelectric vibrator into charges inside the piezoelectric element.

23. An acceleration sensor comprising:

a piezoelectric vibrator including a piezoelectric element having a piezoelectric plate and a metal plate attached to the piezoelectric plate, wherein the piezoelectric element includes:
 a first principal surface and a second principal surface opposed to each other, and
 a first electrode formed on the first principal surface and a second electrode formed on the second principal surface; and
conductive protrusions, wherein the conductive protrusions are formed directly on the piezoelectric vibrator at longitudinal central portions thereof; and a holder for holding the piezoelectric vibrator via the conductive protrusions, wherein the acceleration sensor transduces a distortion in the piezoelectric element generated by a load in the central portions of the piezoelectric vibrator into charges inside the piezoelectric element.

24. An acceleration sensor comprising:

a piezoelectric vibrator including a piezoelectric element having
 a first principal surface and a second principal surface opposed each other,
 a first and second electrode formed on the first and second principal surface, and
 conductive protrusions, wherein the conductive protrusions comprise thermally sprayed melted particles and the thermally sprayed melted particles comprise a heated starting material having a particle size in a range of 5 $\mu$m to 300 $\mu$m, where the starting material is a metal material or a ceramic material, and wherein the conductive protrusions have a height in the range 50 $\mu$m to 150 $\mu$m and the conductive protrusions form a thick film having a minute roughness surface, wherein the minute roughness is in a range of 2 $\mu$m to 10 $\mu$m; and a holding body for the piezoelectric vibrator via the conductive protrusions, wherein a length in a longitudinal direction of the piezoelectric element is longer than 3.5 time of that in a width direction.

* * * * *